United States Patent
Zhou et al.

(10) Patent No.: US 12,356,680 B2
(45) Date of Patent: Jul. 8, 2025

(54) NANOSHEET DEVICE WITH AIR-GAPED SOURCE/DRAIN REGIONS

(71) Applicant: International Business Machines Corporation, Armonk, NY (US)

(72) Inventors: Huimei Zhou, Albany, NY (US); Yi Song, Albany, NY (US); Kangguo Cheng, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 717 days.

(21) Appl. No.: 17/545,713

(22) Filed: Dec. 8, 2021

(65) Prior Publication Data

US 2023/0178596 A1 Jun. 8, 2023

(51) Int. Cl.
*H10D 30/67* (2025.01)
*H10D 30/01* (2025.01)
(Continued)

(52) U.S. Cl.
CPC ......... *H10D 62/116* (2025.01); *H10D 30/031* (2025.01); *H10D 30/6713* (2025.01);
(Continued)

(58) Field of Classification Search
CPC ......... H01L 29/0653; H01L 21/823412; H01L 21/823418; H01L 29/0665; H01L 29/42392; H01L 29/66742; H01L 29/78618; H01L 29/78696; H01L 29/0673; H01L 29/66439; H01L 29/775; H01L 21/823431; H01L 21/823821; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/02–365; H01L 29/16–1608; H01L 23/5226; H01L 23/528; H01L 29/41775; H01L 29/42324; H01L 29/4234;
(Continued)

(56) References Cited

U.S. PATENT DOCUMENTS 9,508,829 B1  11/2016  Cheng et al.
9,741,792 B2  8/2017  Cheng et al.
(Continued)

FOREIGN PATENT DOCUMENTS

EP       3588544 A1    1/2020

OTHER PUBLICATIONS

International Searching Authority, Notification of Transmittal of the International Search Report and the Written Opinion of the International Searching Authority, Mar. 13, 2023, 15 pages, International Application No. PCT/EP2022/083698.

*Primary Examiner* — Moin M Rahman
(74) *Attorney, Agent, or Firm* — Scully, Scott, Murphy & Presser, P.C.; Samuel Waldbaum

(57) ABSTRACT

A nanosheet device is provided that has high quality epitaxially grown source/drain regions and reduced parasitic capacitance which are afforded by forming an air gap between an epitaxially grown source/drain region and a semiconductor substrate. The isolation provided by the air gap does not need to extend beneath the channel region of the nanosheet device.

12 Claims, 41 Drawing Sheets

(51) Int. Cl.
*H10D 62/10* (2025.01)
*H10D 84/01* (2025.01)
*H10D 84/03* (2025.01)

(52) U.S. Cl.
CPC ..... *H10D 30/6735* (2025.01); *H10D 30/6757* (2025.01); *H10D 62/118* (2025.01); *H10D 84/0128* (2025.01); *H10D 84/013* (2025.01); *H10D 84/038* (2025.01)

(58) Field of Classification Search
CPC ......... H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H01L 21/02603; H01L 21/28568; H01L 21/30604; H01L 25/105; H01L 21/30625; H01L 21/6835; H01L 21/76224; B82Y 10/00; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H10B 12/36; H10B 12/056; H10D 62/116; H10D 30/031; H10D 30/6713; H10D 30/6735; H10D 30/6757; H10D 62/118; H10D 84/0128; H10D 84/013; H10D 84/038; H10D 30/43; H10D 30/014; H10D 62/121; H10D 30/794; H10D 30/797; H10D 62/115; H10D 62/151; H10D 62/292; H10D 62/822; H10D 64/017; H10D 64/021; H10D 64/257; H10D 64/62; H10D 30/0323; H10D 30/6744; H10D 64/251; H10D 62/364; H10D 84/0193; H10D 84/853; H10D 84/85; H10D 30/6728; H10D 30/6733; H10D 89/931; H10D 64/252; H10D 84/0188; H10D 84/201; H10D 18/60; H10D 30/62–6219; H10D 30/024–0245; H10D 84/0158; H10D 86/011; H10D 84/834; H10D 86/215; H02K 15/027; A23B 2/783; A45C 11/003; A61K 40/4218; H10F 77/955; H10H 20/826

See application file for complete search history.

(56) References Cited

U.S. PATENT DOCUMENTS

| | | | |
|---|---|---|---|
| 9,881,998 | B1 | 1/2018 | Cheng et al. |
| 9,984,936 | B1 | 5/2018 | Xie et al. |
| 10,170,638 | B1 | 1/2019 | Reznicek |
| 10,243,043 | B2 | 3/2019 | Mochizuki et al. |
| 11,107,752 | B2 | 8/2021 | Zhang et al. |
| 2017/0133459 | A1 | 5/2017 | Pranatharthiharan et al. |
| 2017/0309719 | A1 | 10/2017 | Sun et al. |
| 2018/0261670 | A1 | 9/2018 | Yeung et al. |
| 2018/0301564 | A1 | 10/2018 | Kwon et al. |
| 2020/0044023 | A1* | 2/2020 | Reznicek ............. H10D 62/151 |
| 2021/0367032 | A1 | 11/2021 | Chen et al. |
| 2022/0310452 | A1* | 9/2022 | Wu ................. H01L 21/823431 |
| 2023/0120532 | A1* | 4/2023 | Hong ................. H01L 27/0886 257/382 |

* cited by examiner

US 12,356,680 B2

NANOSHEET DEVICE WITH AIR-GAPED SOURCE/DRAIN REGIONS

BACKGROUND

The present application relates to semiconductor technology, and more particularly to a semiconductor structure including an air gap located beneath a source/drain region that is located on each side of a nanosheet device.

The use of non-planar semiconductor devices is the next step in the evolution of complementary metal oxide semiconductor (CMOS) devices. One type of non-planar semiconductor device that has been touted as a viable option beyond the 7 nm technology node is a nanosheet device. By "nanosheet device" it is meant that the device contains one or more suspended semiconductor channel material nanosheets that are stacked one over the other, in which a functional gate structure is formed in a wrap-around manner on the one or more suspended semiconductor channel material nanosheets.

In current nanosheet devices, a full bottom dielectric isolation layer is typically employed to shut-off the substrate leakage path (and thus reduce parasitic capacitance) in both the source/drain region and under the channel region. However, in conventional full bottom dielectric isolation processing schemes, the source/drain regions are epitaxially grown from a dielectric material, i.e., the full bottom dielectric isolation layer, rather than a semiconductor surface. Source/drain regions that are epitaxially grown on a semiconductor surface are of better quality, than source/drain regions that are epitaxially grown on a full bottom dielectric isolation layer. Also, source/drain regions that are epitaxially grown on a semiconductor surface can have potentially a higher stress due to lattice mismatch. There is a need to provide a nanosheet device including high quality epitaxially grown source/drain regions and reduced parasitic capacitance.

SUMMARY

A nanosheet device is provided that has high quality epitaxially grown source/drain regions and reduced parasitic capacitance which are afforded by forming an air gap between an epitaxially grown source/drain region and a semiconductor substrate. The isolation provided by the air gap does not need to extend beneath the channel region of the nanosheet device.

In one aspect of the present application, a semiconductor structure is provided. In one embodiment, the semiconductor structure includes a nanosheet device located on a semiconductor substrate and including at least one suspended semiconductor channel material nanosheet of a nanosheet stack. A source/drain region is present that extends outward from a sidewall of the at least one suspended semiconductor channel material nanosheet of the nanosheet stack. An air gap is located between the source/drain region and the semiconductor substrate. The air gap extends beneath a topmost surface of the semiconductor substrate and stops on a sub-surface of the semiconductor substrate.

In another aspect of the present application, a method of forming a semiconductor structure is provided. In one embodiment, the method includes forming at least one nanosheet stack of alternating recessed sacrificial semiconductor channel material nanosheets and semiconductor channel material nanosheets on a surface of a semiconductor substrate and beneath a sacrificial gate structure wherein a trench is present in the semiconductor substrate and on each side of the at least one nanosheet stack, and an inner spacer is located laterally adjacent to each recessed sacrificial semiconductor material nanosheet. A sacrificial semiconductor material is then epitaxially grown from a sub-surface of the semiconductor substrate, wherein the sacrificial semiconductor material has a topmost surface that is substantially coplanar with a topmost surface of a bottommost recessed sacrificial semiconductor channel material nanosheet of the alternating recessed sacrificial semiconductor channel material nanosheets. Next, a source/drain region is epitaxially grown from a sidewall of the semiconductor channel material nanosheets and on the sacrificial semiconductor material. An interlayer dielectric material layer is then formed on the source/drain region. Next, the sacrificial gate structure and the recessed sacrificial semiconductor channel material nanosheets are removed to provide a gate cavity, and a functional gate structure is formed in the gate cavity. The interlayer dielectric material layer is then recessed to provide a recessed interlayer dielectric material layer and to physically expose the source/drain region. Next, the sacrificial semiconductor material is selectively removed to provide a cavity beneath the source/drain region and, thereafter, an interlayer dielectric material-containing structure is formed at least laterally adjacent to the cavity to seal the cavity and provide an air gap beneath the source/drain region.

DETAILED DESCRIPTION

Figure 2:
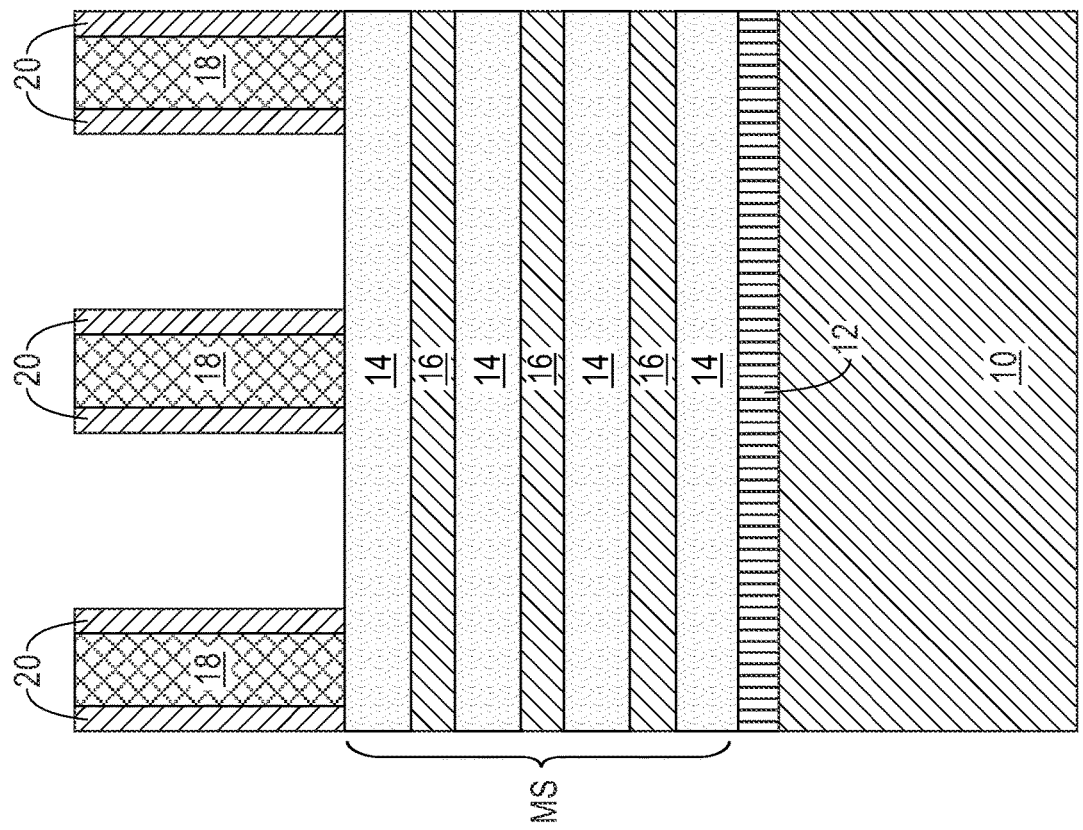
FIG. 2 is a cross sectional view of an exemplary structure through cut X-X shown in FIG. 1 that can be employed in accordance with an embodiment of the present application, the exemplary structure including at least one sacrificial gate structure located on a portion of a material stack including alternating sacrificial semiconductor material layers and semiconductor channel material layers, wherein the material stack is present on a bottom dielectric isolation layer that is disposed on a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
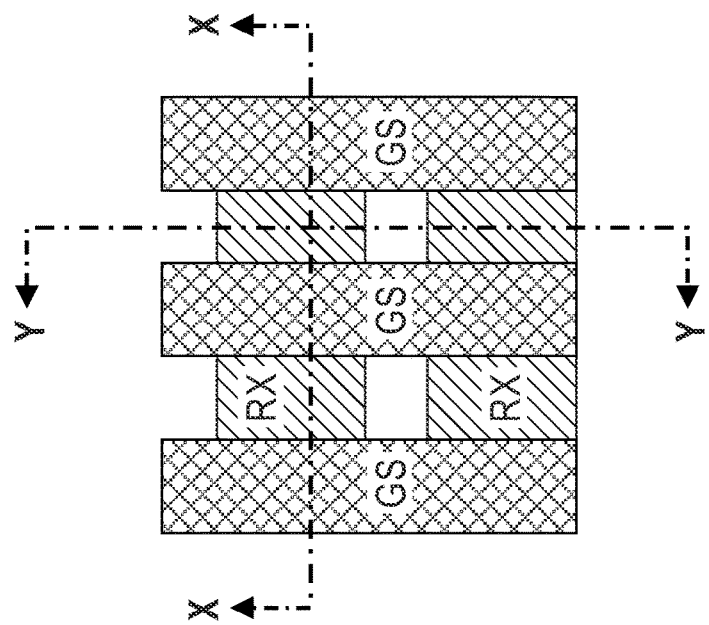
FIG. 1 is a layout including a plurality of gate structures that extend over a portion of a pair of active device regions including cuts X-X and Y-Y that will be used in the present application to describe various cross sectional views of the exemplary semiconductor structure of the present application.

Referring first to FIG. 1, there is illustrated a layout including a plurality of gate structures GS that extend over a portion of a pair active device regions RX including cuts X-X and Y-Y that will be used in the present application to describe various cross sectional views of the exemplary semiconductor structure of the present application. Cut X-X is a cross sectional view along a length direction of one of the active device regions, while cut Y-Y is in a source/drain region located between a neighboring pair of gate structures GS. The term gate structures includes sacrificial gate structures and functional gate structures, while the term active device region denotes a region in which one or more semiconductor devices will be subsequently formed. In the present application, FIGS. 2-12A, 13A, 14A, 15A, 16A, 17A, 18A, 19A, 20A, 21A, 22A, 23A, 24A, 25A, 26A and 27A are cross sectional views through cut X-X, while FIGS. 12B, 13B, 14B, 15B, 16B, 17B, 18B, 18C, 19B, 20B, 21B, 22B, 23B, 24B, 25B, 25C, 26B and 27B are cross sectional views through cut Y-Y.

Referring now to FIG. 2, there is illustrated an exemplary structure through cut X-X shown in FIG. 1 that can be employed in accordance with an embodiment of the present application. The exemplary structure illustrated in FIG. 2 includes at least one sacrificial gate structure 18 located on a portion of a material stack MS including alternating sacrificial semiconductor material layers 14 and semiconductor channel material layers 16. As is illustrated, the material stack MS is present on a bottom dielectric isolation layer 12 that is disposed on a semiconductor substrate 10. A dielectric spacer 20 is also present along a sidewall of the at least one sacrificial gate structure 18. Although not shown, the dielectric spacer 20 is also present along a sidewall of the material stack MS.

In FIG. 2, three sacrificial gate structures 18 are shown by way of one example. Although three sacrificial gate structures 18 are shown and illustrated, the present application is not limited to that number of sacrificial gate structures being present on the material stack MS. Instead, the present application works equally well when less than three (i.e., one or two) or more than 3 (i.e., four, five, six, etc.) sacrificial gate structures 18 are employed. Also, although only a single material stack MS is described and illustrated, the present application contemplates embodiments when more than one material stack MS is employed. The additional nanosheet materials stacks would run in front of and behind the material stack MS shown in FIG. 2. It is noted that when a plurality of material stacks MS are employed, the sacrificial gate structures 18 would be located on a portion of each material stack MS. In the present application, the sacrificial gate structures 18 straddle over each of the nanosheet materials stacks MS that are present. By "straddle over" it is meant that the sacrificial gate structure 18 is present on a topmost surface and along sidewalls of the material stack MS.

Semiconductor substrate 10 can be composed of a semiconductor material having semiconductor properties. Illustrative examples of semiconductor materials that can be used in the present application include, but are not limited to, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe). In one embodiment (depicted in the drawings of the present application), the semiconductor substrate is entirely composed of at least one semiconductor material. In such an embodiment, the semiconductor substrate 10 can be referred to as a bulk semiconductor substrate. In other embodiments (not shown in the drawings of the present application), semiconductor substrate 10 can be composed of a first semiconductor material layer, a buried insulator layer such as for example, silicon dioxide and/or boron nitride, and a top semiconductor material layer. In such an embodiment, the semiconductor substrate 10 can be referred to as a semiconductor-on-insulator substrate.

The bottom dielectric isolation layer 12 is composed of any dielectric material having electrical insulating properties. Illustrative examples of dielectric materials that can be employed in providing the bottom dielectric isolation layer 12 include, but are not limited to, silicon dioxide, silicon nitride, silicon oxynitride, or boron nitride. The bottom dielectric isolation layer 12 can have a thickness from 5 nm to 50 nm; although other thicknesses are contemplated and can be employed as the thickness of the dielectric material.

As mentioned above, each material stack MS includes alternating sacrificial semiconductor material layers 14 and semiconductor channel material layers 16. In the present application, each semiconductor channel material layer 16 is sandwiched between a bottom sacrificial semiconductor material layer and a top sacrificial semiconductor material layer. Thus, the material stack MS includes 'n' number of semiconductor channel material layers 16 and 'n+1' number of sacrificial semiconductor material layers 14, wherein n is an integer starting from one. By way of one example, the material stack MS includes four sacrificial semiconductor material layers 14 and three semiconductor channel material layers 16.

Each sacrificial semiconductor material layer 14 is composed of a first semiconductor material, while each semiconductor channel material layer 16 is composed of a second semiconductor material that is compositionally different from the first semiconductor material. In some embodiments, the second semiconductor material that provides each semiconductor channel material layer 16 is a semiconductor material that is capable of providing high channel mobility for n-type FET devices. In other embodiments, the second semiconductor material that provides each semiconductor channel material layer 16 is a semiconductor material that is capable of providing high channel mobility for p-type FET devices.

The first semiconductor material that provides each sacrificial semiconductor material layer 14, and the second semiconductor material that provides each semiconductor channel material layer 16 can include one of the semiconductor materials mentioned above for the semiconductor substrate 10. In the present application, the first semiconductor material that provides each sacrificial semiconductor material layer 14 can be compositionally the same as, or compositionally different from, at least an uppermost semiconductor material portion of the semiconductor substrate 10. The second semiconductor material that provides each semiconductor channel material layer 16 can be compositionally the same as, or compositionally different from, at least an uppermost semiconductor material portion of the semiconductor substrate 10. Typically, the second semiconductor material that provides each semiconductor channel material layer 16 is compositionally the same as at least the uppermost semiconductor material portion of the semiconductor substrate 10. In one example, the semiconductor substrate 10 is composed silicon, the first semiconductor material that provides each sacrificial semiconductor material layer 14 is composed of a silicon germanium alloy, and the second semiconductor material that provides each semiconductor channel material layer 16 is composed of silicon. Other combinations of semiconductor materials are possible as long as the first semiconductor material that provides each sacrificial semiconductor material layer 14 is compositionally different from the second semiconductor material that provides each semiconductor channel material layer 16.

The material stack MS can be formed by growing alternating blanket layers of sacrificial semiconductor material and semiconductor channel material on a placeholder material layer (not shown). The placeholder material layer is typically composed of a semiconductor material that is compositionally different from the sacrificial semiconductor material, the semiconductor channel material and the semiconductor substrate, and is subsequently replaced with a dielectric material to provide the bottom dielectric isolation layer 12. The placeholder material layer is typically formed by an epitaxial growth process. The alternating blanket layers of sacrificial semiconductor material and semiconductor channel material can be deposited utilizing epitaxial growth. The alternating blanket layers of sacrificial semiconductor material and semiconductor channel material and the as deposited placeholder material layer are then patterned by lithography and etching to form a patterned sacrificial placeholder material layer (not shown) and the material stack MS. The etch goes through the alternating blanket layers of sacrificial semiconductor material and semiconductor channel material and the as deposited blanket dielectric material layer, and into a top portion of the semiconductor substrate 10 forming a shallow trench isolation (STI) trench (not shown) at least between different active device regions. The STI trench can then be processed to include an STI dielectric material so as to provide a STI structure between the different active device regions. An STI structure 11 is shown in the cross sectional views along the cut Y-Y. See, for example, FIG. 12B, 13B, etc.

Next, at least one sacrificial gate structure 18 is formed. The at least one sacrificial gate structure 18 includes at least a sacrificial gate material. In some embodiments, the at least one sacrificial gate structure 18 can include a sacrificial gate dielectric material located beneath the sacrificial gate material. A sacrificial gate cap can be located on the sacrificial gate material. The at least one sacrificial gate structure 18 further includes a dielectric spacer 20 located along the sidewalls thereof; the dielectric spacer 20 is also present on the a topmost surface and sidewalls of the material stack MS.

The at least one sacrificial gate structure 18 can be formed by depositing blanket layers of a sacrificial gate dielectric material (such as, for example, silicon dioxide), a sacrificial gate material (such as, for example, polysilicon or a metal), and a dielectric hard mask material (such as, for example, silicon nitride); note that the dielectric hard mask material provides a sacrificial gate cap. In some embodiments, the depositing of a blanket layer of the sacrificial gate dielectric material and/or the dielectric hard mask material can be omitted. The depositing of the blanket layers of the dielectric hard mask material, sacrificial gate material, and sacrificial gate dielectric material includes, but is not limited to, CVD, PECVD, PVD, ALD or any combination of such deposition processes. After forming the blanket layers of sacrificial gate dielectric material, sacrificial gate material, and hard mask material, a patterning process (including lithography and etching) is used to convert the blanket layer of hard mask material into a sacrificial gate cap and the blanket layers of the sacrificial gate dielectric material and the sacrificial gate dielectric material into at least one sacrificial gate structure 18.

After forming the at least one sacrificial gate structure 18, dielectric spacer 20 is then formed by deposition of a dielectric spacer material, followed by a spacer etch. The dielectric spacer material that provides dielectric spacer 20 can include silicon dioxide or silicon nitride. At this point of the present application, the patterned placeholder material layer is replaced with a dielectric material to provide the bottom dielectric isolation layer 12. The replacing of the patterned placeholder material layer includes etching, deposition of a dielectric material, and thereafter performing an etch back process.

Figure 3:
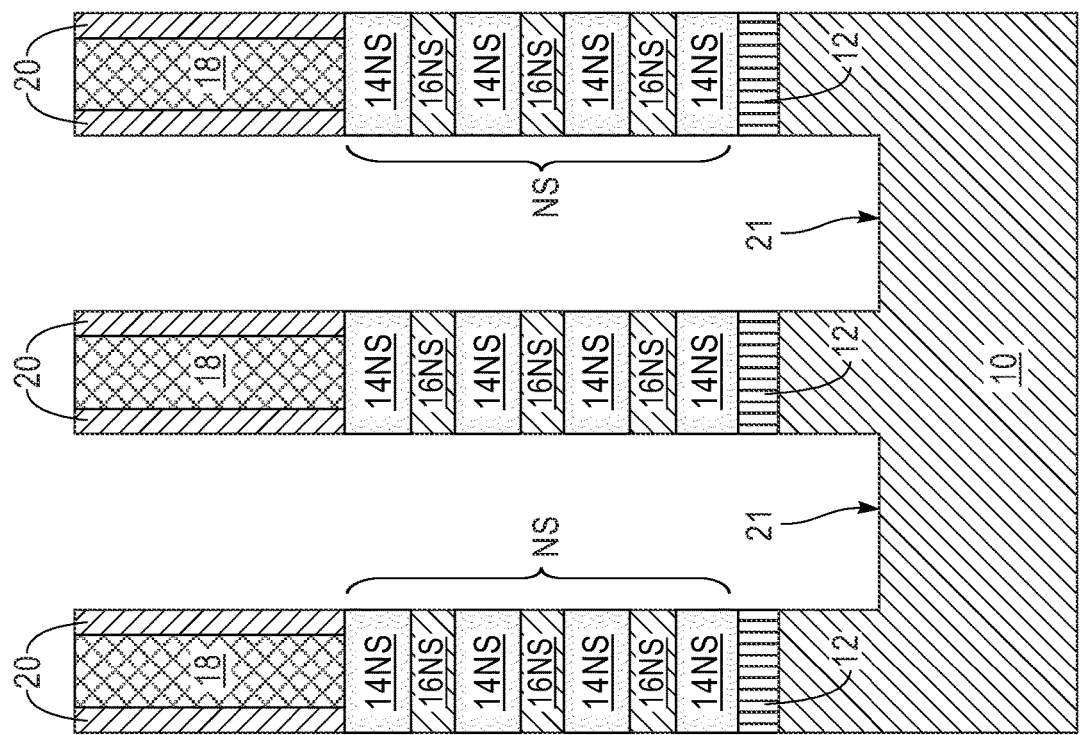
FIG. 3 is a cross sectional view of the exemplary structure shown in FIG. 2 after patterning the material stack and the underlying dielectric material layer, wherein the patterning includes an etching process that etches entirely through the material stack to provide at least one vertical nanosheet stack including alternating sacrificial semiconductor material nanosheets and semiconductor channel material nanosheets, entirely through the bottom dielectric isolation layer, and partially into the semiconductor substrate to provide at least one trench in the semiconductor substrate, wherein the at least one trench physically exposes a sub-surface of the semiconductor substrate.

Referring now to FIG. 3, there is illustrated the exemplary structure shown in FIG. 2 after patterning the material stack MS and the underlying bottom dielectric isolation layer 12, wherein the patterning includes an etching process that etches entirely through the material stack MS to provide at least one vertical nanosheet stack NS including alternating sacrificial semiconductor material nanosheets 14NS and semiconductor channel material nanosheets 16NS, entirely through the bottom dielectric isolation layer 12, and partially into the semiconductor substrate 10 to provide at least one trench 21 in the semiconductor substrate 10, wherein the at least one trench 21 physically exposes a sub-surface of the semiconductor substrate 10. The term "sub-surface" is used throughout the present application to denote a surface of a material/structure that is located between a topmost surface and a bottom surface of the material/substrate. In the present application, trench 21 can be referred to a source/drain trench since the source/drain region will be subsequently formed in an area above trench 21. In the present application, the physically exposed sub-surface of the semiconductor substrate 10 needs to be a semiconductor surface.

The patterning process, which uses the at least one sacrificial gate structure 18 and dielectric spacers 20 as a combined etch mask or with other materials on top acting as a hard mask, converts the material stack MS into the vertical nanosheet stack NS containing alternating sacrificial semiconductor material nanosheets 14NS and semiconductor channel material nanosheets 16NS; the bottom dielectric isolation layer 12 is patterned during this process. Each sacrificial semiconductor material nanosheet 14NS and semiconductor channel material nanosheets 16NS can have a width from 5 nm to 100 nm, and a vertical thickness from 1 nm to 15 nm; this vertical thickness is the same as the as deposited thickness of the sacrificial semiconductor material layers 14 and semiconductor channel material layers 16. At this point of the present application, the patterned bottom dielectric isolation layer 12 has a same width as each sacrificial semiconductor material nanosheet 14NS and semiconductor channel material nanosheets 16NS, and a vertical thickness 1 nm to 25 nm for the dielectric material layer 12. The patterning process includes an etch which removes physically exposed portions of the material stack NS and dielectric material layer 12 not protected by the etch mask, while maintaining a portion of the material stack MS and the bottom dielectric isolation layer 12 beneath each etch mask. The maintained portion of the nanomaterial stack is the vertical nanosheet stack of alternating sacrificial semiconductor material nanosheets 14NS (i.e., remaining portions of each sacrificial semiconductor material layers 14) and semiconductor channel material nanosheets 16NS (remaining portions of the semiconductor channel material layers 16). The maintained portion of the bottom dielectric isolation layer 12 is still referred to herein as bottom dielectric isolation layer 12. The etch can include a dry etching process such as, for example, reactive ion etching (RIE).

The vertical nanosheet stack NS has outermost sidewalls that are vertically aligned to outermost sidewalls of the underlying bottom dielectric isolation layer 12 and an outermost sidewall of the dielectric spacer 20. At this point of the present application, each sacrificial semiconductor material nanosheets 14NS has outermost sidewalls that are vertically aligned to outermost sidewalls of each semiconductor channel material nanosheet 16NS.

Figure 4:
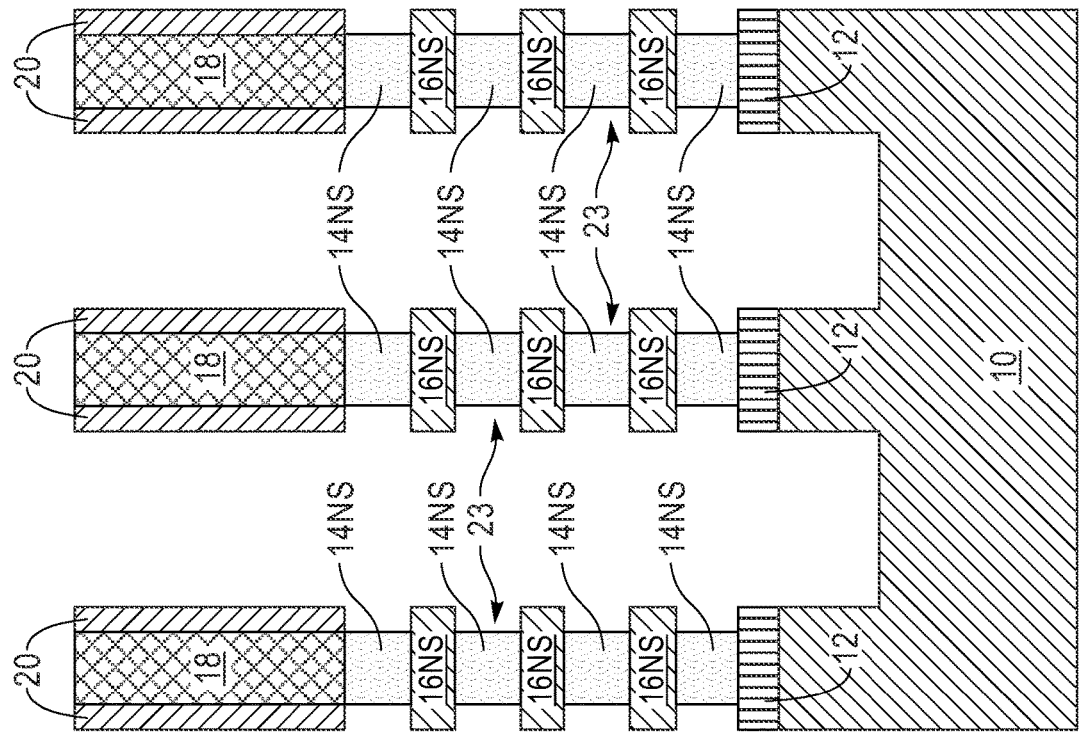
FIG. 4 is a cross sectional view of the exemplary structure shown in FIG. 3 after recessing each sacrificial semiconductor material nanosheet of the at least one vertical nanosheet stack.

Referring now to FIG. 4, there is illustrated the exemplary structure shown in FIG. 3 after recessing each sacrificial semiconductor material nanosheet 14NS of the at least one vertical nanosheet stack NS to form gaps 23. Each gap 23 is formed above and below one of the semiconductor channel material nanosheets 16NS. After this recessing step, the remaining (i.e., recessed) sacrificial semiconductor material nanosheets 14NS have a reduced width as compared to the width of the original sacrificial semiconductor material nanosheets 14NS. The recessing includes a lateral etching process that is selective in removing the sacrificial semiconductor material nanosheets 14NS relative to the semiconductor channel material nanosheets 16NS.

Figure 5:
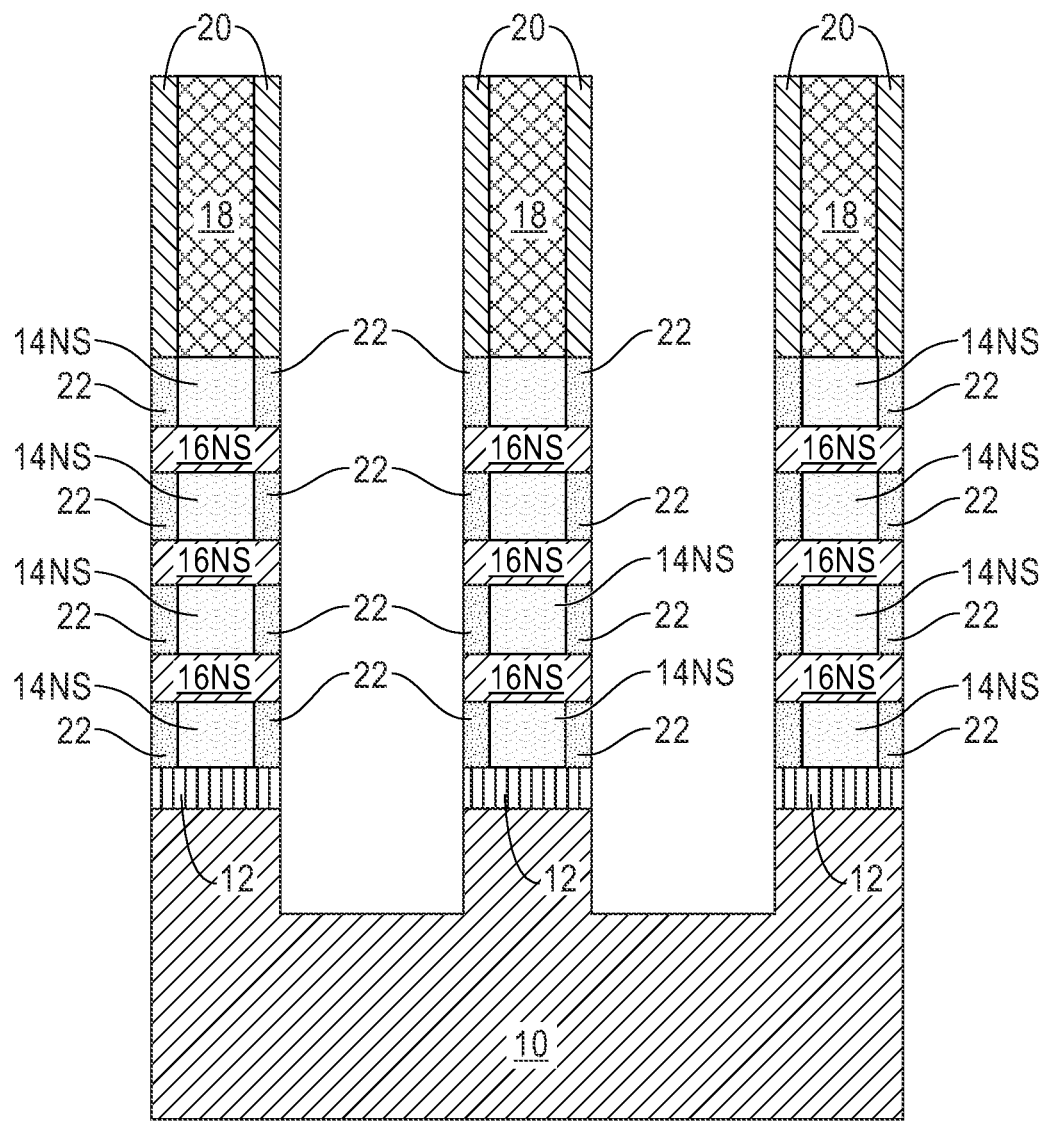
FIG. 5 is a cross sectional view of the exemplary structure shown in FIG. 4 after forming an inner spacer in each gap that is created during the recessing of each sacrificial semiconductor material nanosheet of the at least one vertical nanosheet stack.

Referring now to FIG. 5, there is illustrated the exemplary structure shown in FIG. 4 after forming an inner spacer 22 in each gap 23 that is created during the recessing of each sacrificial semiconductor material nanosheet 14NS of the at least one vertical nanosheet stack NS. The forming of the inner spacer 22 includes conformal deposition of another dielectric spacer material, followed by an isotropic etching. The another dielectric spacer material can be compositionally the same as, or compositionally, different from the dielectric spacer material that provides dielectric spacer 20.

Figure 6:
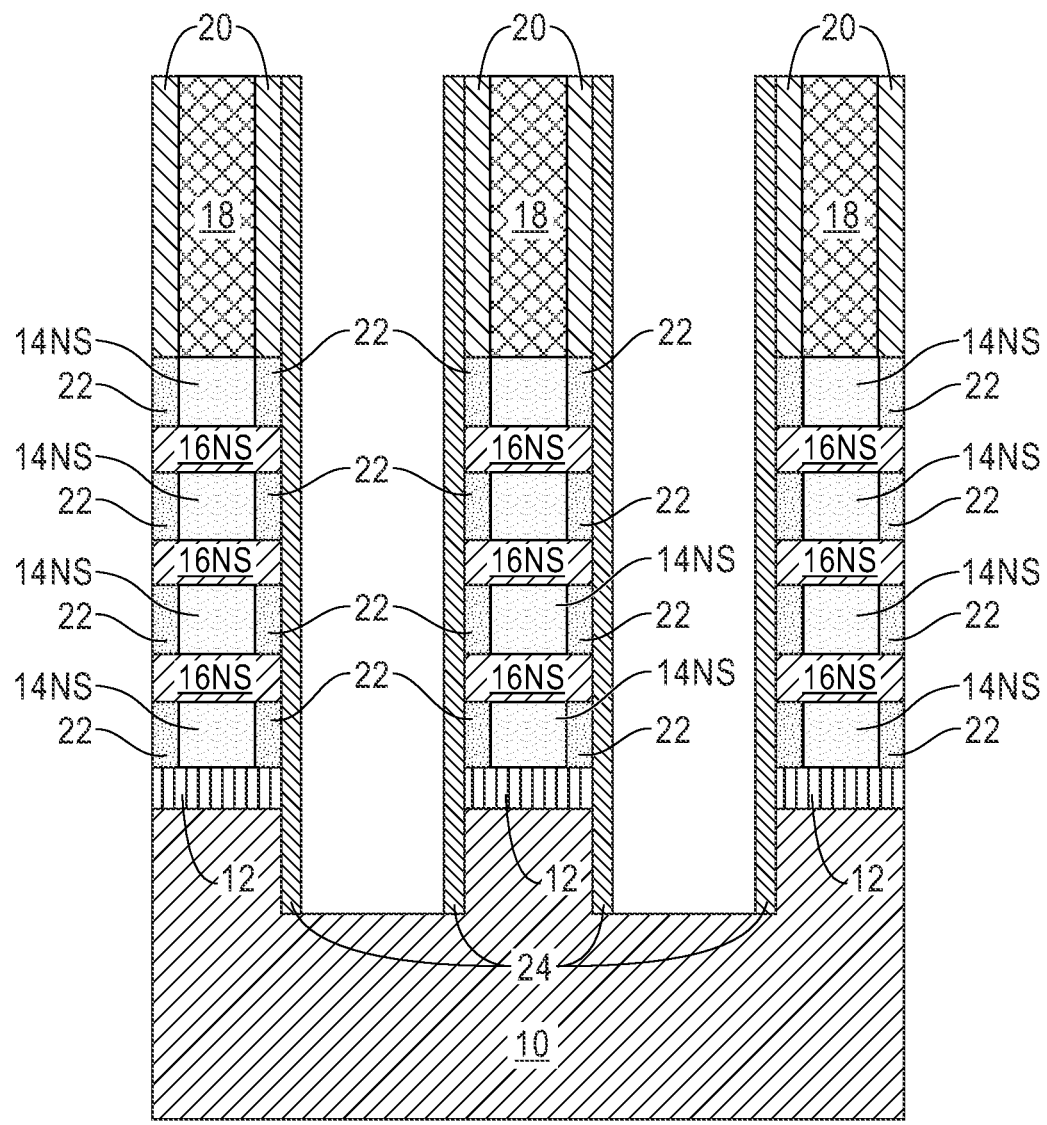
FIG. 6 is a cross sectional view of the exemplary structure shown in FIG. 5 after forming a dielectric liner laterally adjacent to the at least one sacrificial gate structure, the at least one vertical nanosheet stack, the patterned dielectric isolation layer, and a sidewall portion of the at least one trench that is formed into the semiconductor substrate.

Referring now to FIG. 6, there is illustrated the exemplary structure shown in FIG. 5 after forming a dielectric liner 24 laterally adjacent to the at least one sacrificial gate structure 18 (and dielectric spacer 20), the at least one vertical nanosheet stack NS, the bottom dielectric isolation layer 12, and a sidewall portion of the at least one trench 21 that is formed into the semiconductor substrate 10. Dielectric liner 24 is composed of a dielectric material including, but not limited to, silicon nitride or silicon oxynitride. The dielectric liner 24 can be compositionally the same as, or compositionally different from, the dielectric spacer material that provides inner spacer 22 and/or dielectric spacer 20. Dielectric liner 24 can be formed by first depositing (e.g., CVD, PECVD, PVD or ALD) a conformal dielectric material layer on all physically exposed surfaces of the exemplary structure shown in FIG. 5 and thereafter an anisotropic etch (such as, an isotropic RIE) is employed to remove the conformal dielectric material layer from all horizontal surfaces so as to provide dielectric liner 24 as shown in FIG. 6. The term "conformal" denotes that a material layer has a same thickness along vertical surfaces as along horizontal surfaces. The dielectric liner 24 can have a thickness from 5 nm to 50 nm; however other thicknesses are contemplated and can be used as long as the thickness of the dielectric liner 24 does not completely fill in trench 21.

Figure 7:
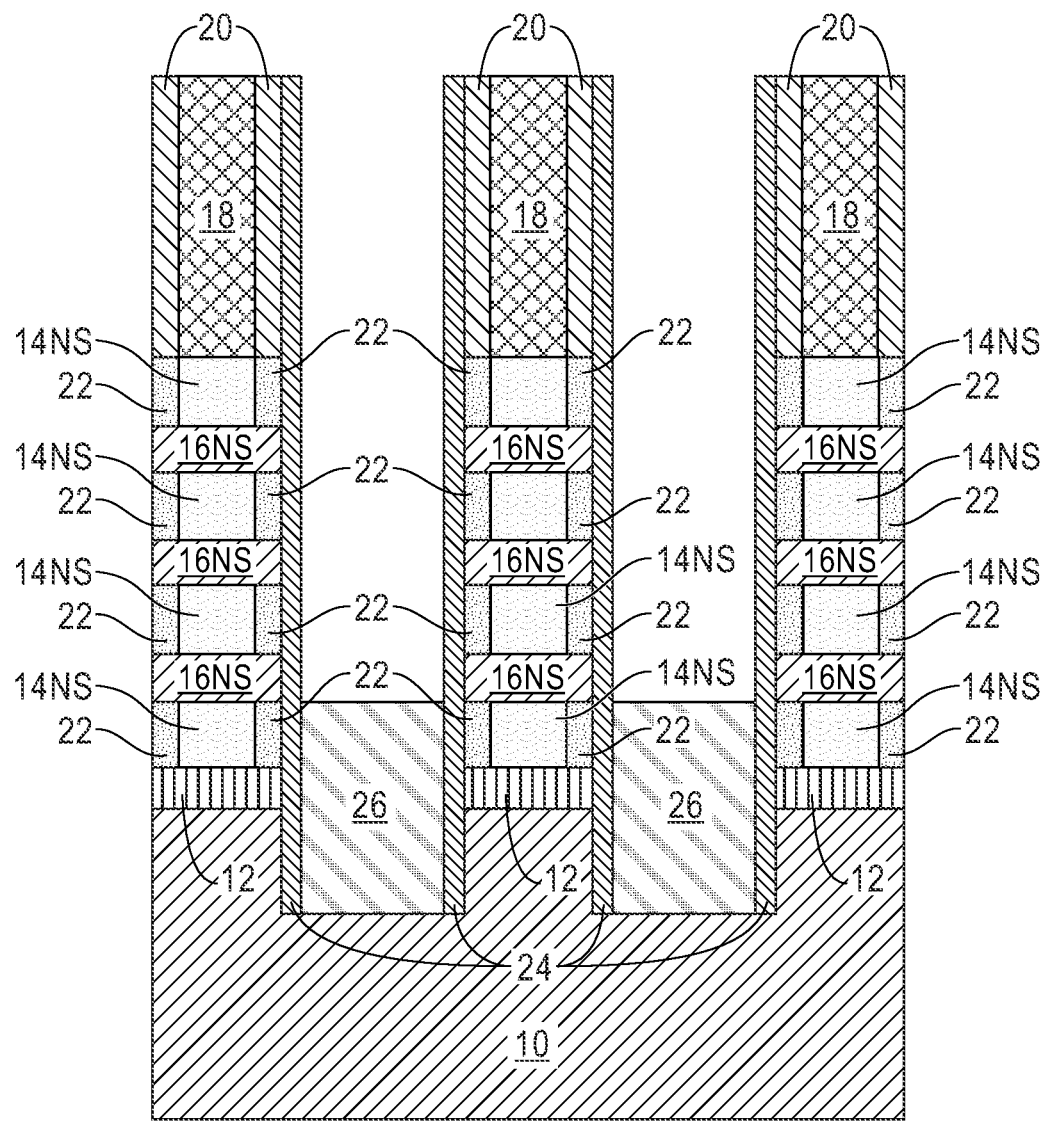
FIG. 7 is a cross sectional view of the exemplary structure shown in FIG. 6 after epitaxially growing a sacrificial semiconductor material in the at least one trench.

Referring now to FIG. 7, there is illustrated the exemplary structure shown in FIG. 6 after epitaxially growing a sacrificial semiconductor material 26 in the at least one trench 21. Notably, the sacrificial semiconductor material 26 is epitaxially grown upward from the sub-surface of the semiconductor substrate 10 and since this sub-surface is a semiconductor material the sacrificial semiconductor material 26 has an epitaxial relationship with the semiconductor material sub-surface of semiconductor substrate 10.

The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The sacrificial semiconductor material 26 includes one of the semiconductor materials mentioned above for the semiconductor substrate 10. The sacrificial semiconductor material 26 is composed of a compositionally different semiconductor material than at least the physically exposed sub-surface of the semiconductor substrate 10 such that in a subsequent processing step, the sacrificial semiconductor material 26 can be selectively removed. In one example, the sacrificial semiconductor material 26 is composed of a silicon germanium alloy having a germanium content of at least 20 atomic percent. The sacrificial semiconductor material 26 has a vertical height such that the topmost surface of the sacrificial semiconductor material 26 is located above a topmost surface of semiconductor substrate 10, and preferably above a topmost surface of the bottom dielectric isolation layer 12, but coplanar with or below, a topmost surface of the bottommost sacrificial semiconductor material nanosheet 14NS.

Figure 8:
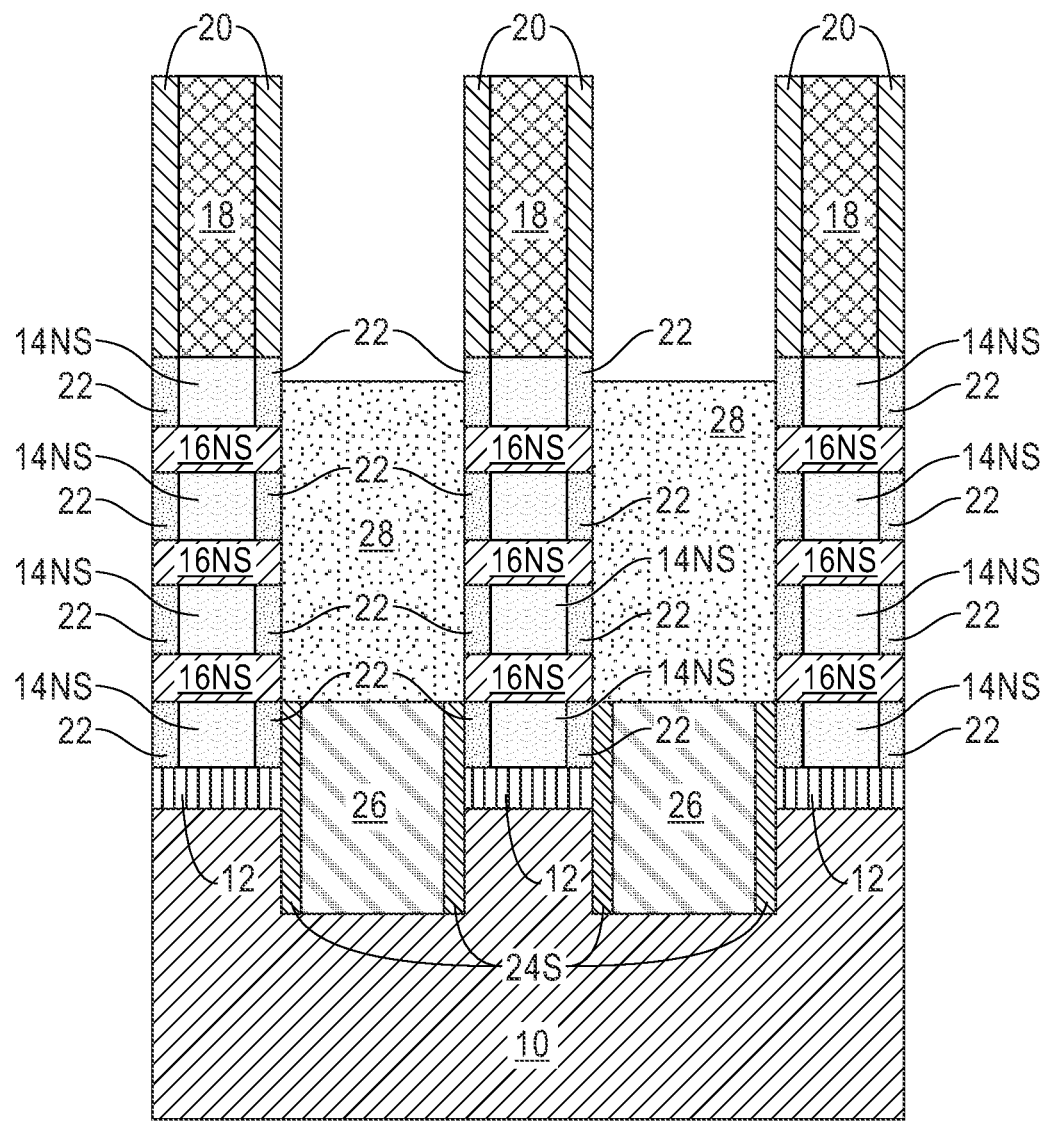
FIG. 8 is a cross sectional view of the exemplary structure shown in FIG. 7 after removing the dielectric liner to reveal each semiconductor channel material nanosheet of the least one vertical nanosheet stack, and epitaxially growing a source/drain region outward from a physically exposed sidewall of each semiconductor channel material nanosheet of the least one vertical nanosheet stack and upward from the sacrificial semiconductor material.

Referring now to FIG. 8, there is illustrated the exemplary structure shown in FIG. 7 after removing the dielectric liner 24 to reveal each semiconductor channel material nanosheet 16NS of the least one vertical nanosheet stack NS, and epitaxially growing a source/drain region 28 outward from a physically exposed sidewall of each semiconductor channel material nanosheet 16NS of the least one vertical nanosheet stack and upwards from the sacrificial semiconductor material 26.

The removal of the dielectric liner 24 includes a recess etch that is selective in removing the dielectric material that provides the dielectric liner 24 and reduces the height of the dielectric liner 24 such that each semiconductor channel material nanosheet 16NS is revealed. Portions of the dielectric liner 24 remain and are referred to herein as a dielectric trench spacer 24S. Each dielectric trench spacer 24S has a bottommost surface that is in direct physical contact with the sub-surface of the semiconductor substrate 10. In the final structure, as illustrated in FIGS. 20A-20B and 27A-27B, a topmost surface of each dielectric trench spacer 24S contacts a bottommost surface of source/drain region 28 (to be subsequently described).

The source/drain region 28 is formed by an epitaxial growth process as defined above, and since the source/drain region 28 is epitaxially grown on an epitaxially grown sacrificial semiconductor material 26, the source/drain region 28 has a same crystal orientation as at least the sub-surface of the semiconductor substrate 10. The source/drain region 28 that is formed by the method of the present application is of high quality. By "high quality" it is meant less defectivity and possible bring more stress. A dopant, as defined below, is typically present during the epitaxial growth process or afterwards implant. A recess etch can be optionally employed so as to reduce the height of each of the source/drain region 28.

As used herein, a "source/drain" region can be a source region or a drain region depending on subsequent wiring and application of voltages during operation of the FET. The source/drain region 28, which is formed on each side of the at least one sacrificial gate structure 18, has a sidewall that is in direct physical contact with the outermost sidewalls of each semiconductor channel material nanosheet 16NS. The source/drain region 28 comprises a semiconductor material and a dopant. The semiconductor material that provides the source/drain region 28 can include one of the semiconductor materials mentioned above for the semiconductor substrate 10. The semiconductor material that provides the source/drain region 28 can be compositionally the same, or compositionally different from each semiconductor channel material nanosheet 16NS. The semiconductor material that provides the source/drain region 28 is however compositionally different from each recessed sacrificial semiconductor material nanosheet 14NS and the underlying sacrificial semiconductor material 26.

The dopant that is present in each source/drain region 28 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain region 28 can have a dopant concentration of from $4 \times 10^{20}$ atoms/cm$^3$ to $3 \times 10^{21}$ atoms/cm$^3$. In one example, the source/drain region 28 is composed of phosphorus doped silicon.

Figure 9:
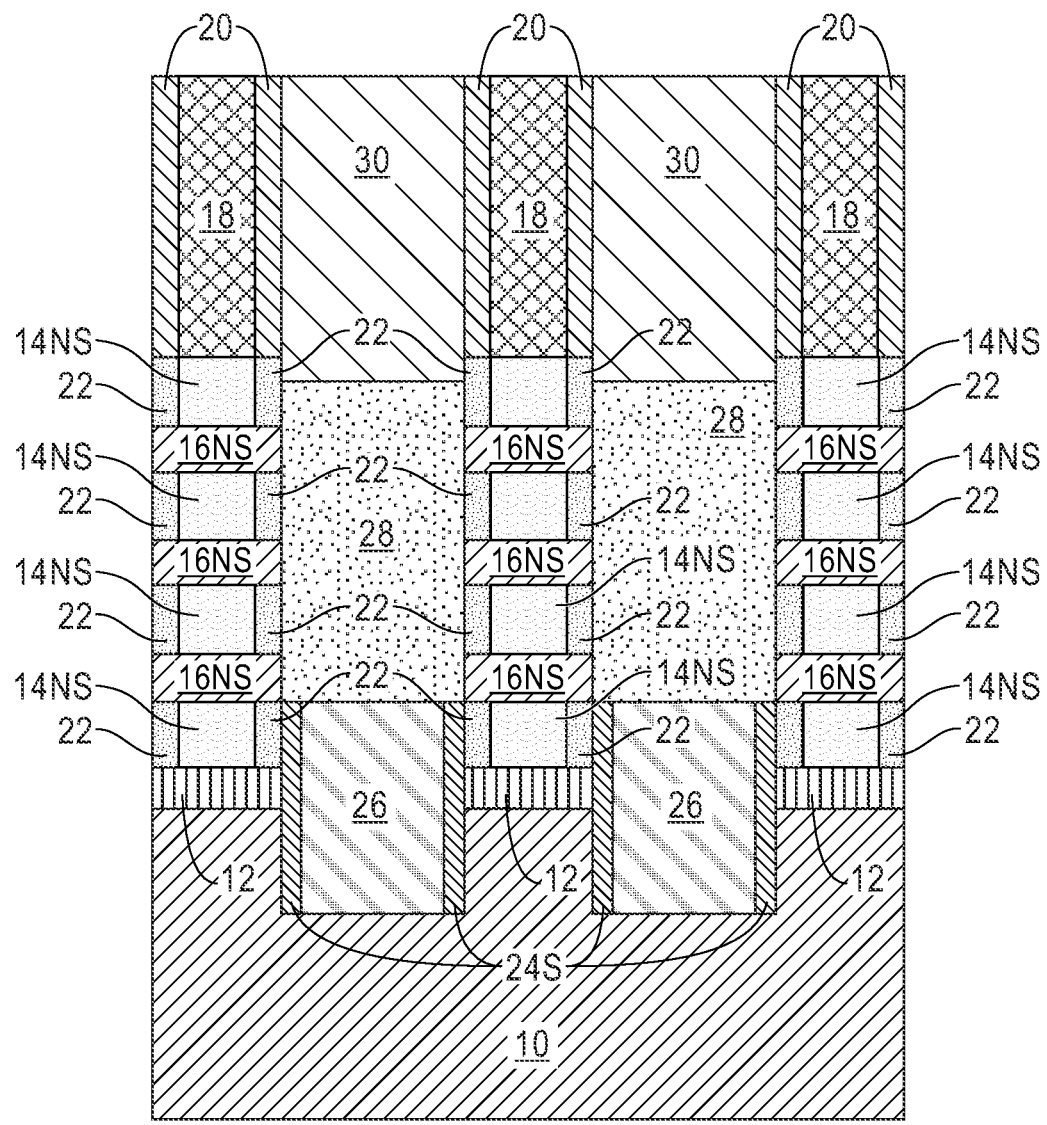
FIG. 9 is a cross sectional view of the exemplary structure shown in FIG. 8 after forming an interlayer dielectric material layer on the source/drain region.

Referring now to FIG. 9, there is illustrated the exemplary structure shown in FIG. 8 after forming an interlayer dielectric (ILD) material layer 30 on the source/drain region 28. The ILD material layer 30 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). Although not shown, the ILD material layer 30 can include a multilayered structure that includes at least two different dielectric materials stacked one atop the other such as, for example, silicon nitride and silicon dioxide. The ILD material layer 30 can be formed by a deposition process such as, for example, CVD, PECVD, or spin-on coating. A planarization process can be performed after the deposition of the dielectric material that provides the ILD material layer 30. The ILD material layer 30 typically has a topmost surface that is coplanar with a topmost surface of the at least one sacrificial gate structure 18 and a topmost surface of dielectric spacer 20. Note that if a sacrificial gate cap is present, the aforementioned planarization step can remove the sacrificial gate cap and reveal the sacrificial gate material of the least one sacrificial gate structure 18. An upper portion of dielectric spacer 20 can also be removed by this planarization step.

Figure 10:
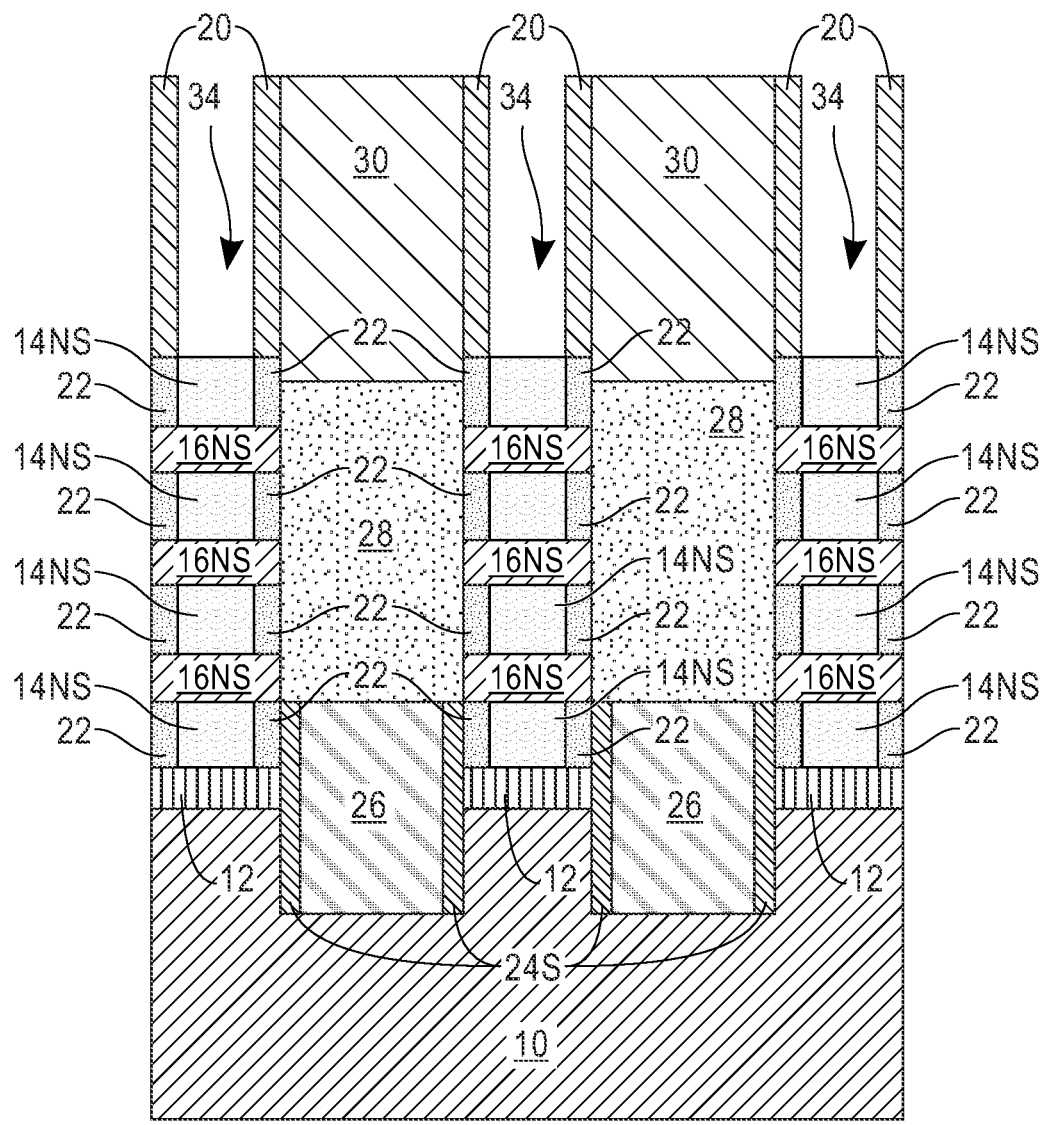
FIG. 10 is a cross sectional view of the exemplary structure shown in FIG. 9 after removing the at least one sacrificial gate structure to reveal the at least one vertical nanosheet stack.

Referring now to FIG. 10, there is illustrated the exemplary structure shown in FIG. 9 after removing the at least one sacrificial gate structure 18 to reveal the at least one vertical nanosheet stack NS. The removal of the at least one sacrificial gate structure 18 can include one or more etching processes that are selective in removing the at least one sacrificial gate structure 18. A pre-gate cavity 34 is formed in the area that previously included that at least one sacrificial gate structure 18.

Figure 11:
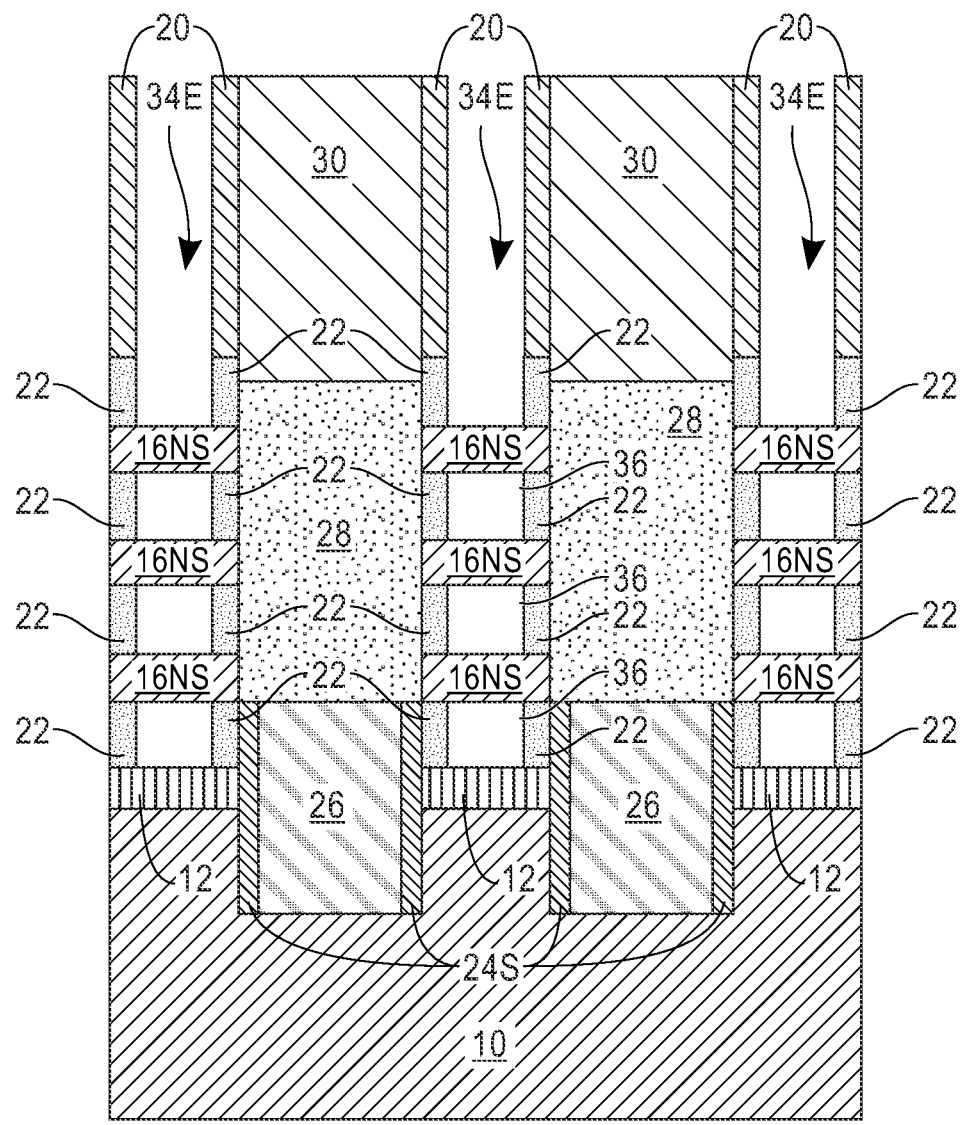
FIG. 11 is a cross sectional view of the exemplary structure shown in FIG. 10 after removing each recessed sacrificial semiconductor material nanosheet of the at least one vertical nanosheet stack to provide a gate cavity.

Referring now to FIG. 11, there is illustrated the exemplary structure shown in FIG. 10 after removing each recessed sacrificial semiconductor material nanosheet 14NS of the at least one vertical nanosheet stack NS to provide a gate cavity 34E; gate cavity 34E includes pre-gate cavity 34. The removal of the recessed sacrificial semiconductor material nanosheets 14NS from the vertical nanosheet stack NS can be performed utilizing an etch that is selective in removing the sacrificial semiconductor material nanosheets 14NS relative to the semiconductor channel material nanosheets 16NS. For example, an etch can be used to selectively remove SiGe sacrificial semiconductor material nanosheets relative to Si semiconductor channel material nanosheets. Each semiconductor channel material nanosheet 16NS within the vertical nanosheet stack NS is a suspended semiconductor channel material nanosheet 16NS. It is noted that the dielectric spacers 20 are not free-floating as is illustrated in FIG. 11. Instead, a portion of the dielectric spacers 20 is present along a sidewall of the suspended semiconductor channel material nanosheets 16NS.

Figure 12A:
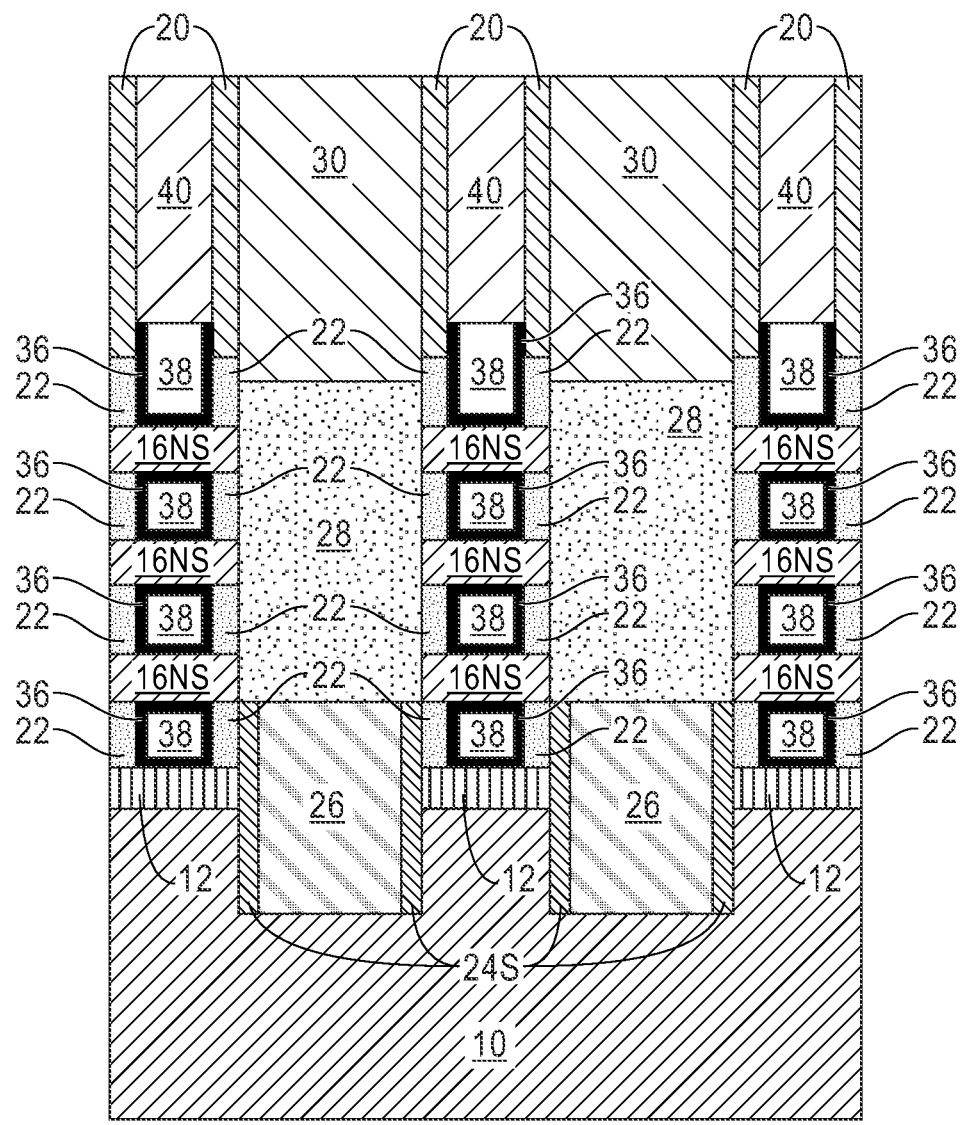
FIG. 12A is cross sectional view of the exemplary structure shown in FIG. 11 after forming a functional gate structure in the volume of the gate cavity.
Figure 12B:
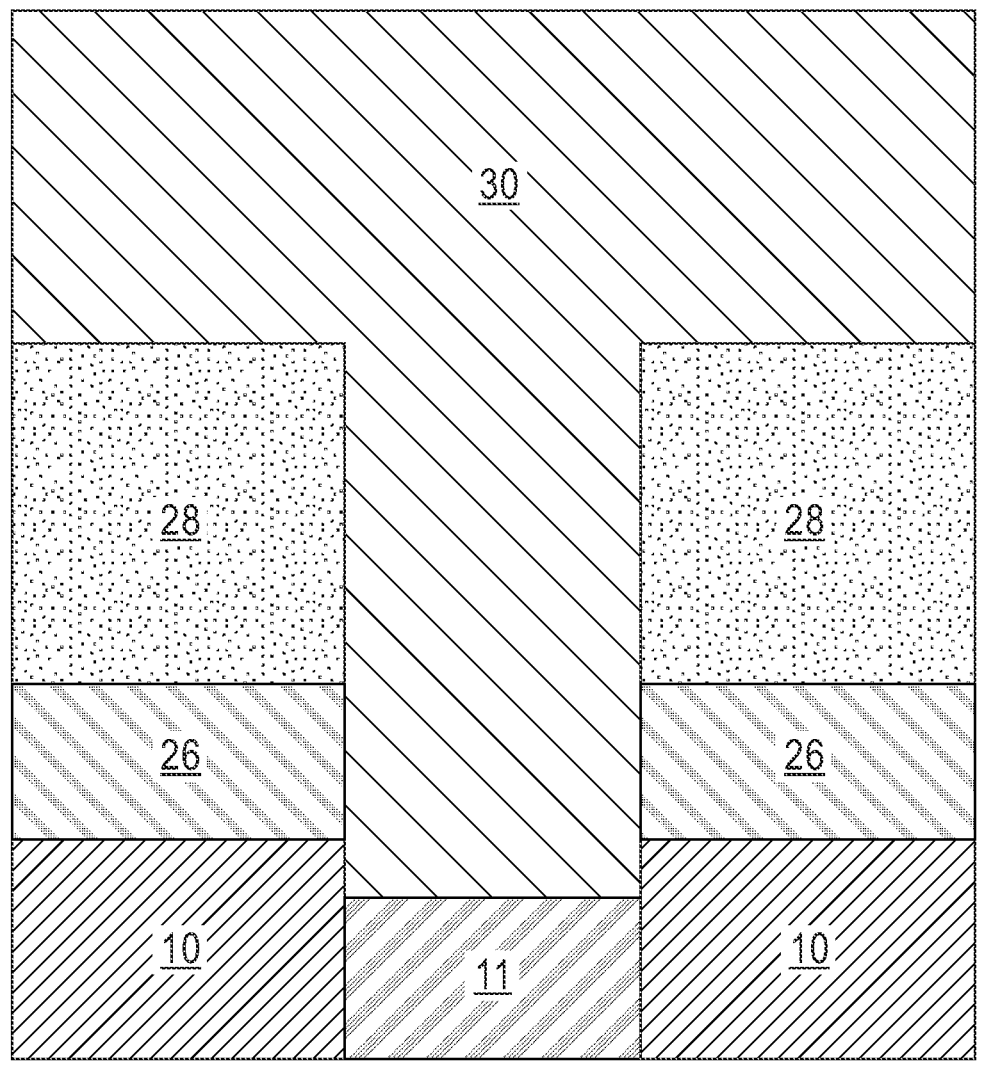
FIG. 12B is a cross sectional view of the exemplary structure shown in FIG. 12A and through cut Y-Y shown in FIG. 1.

Referring now to FIG. 12A, there is illustrated the exemplary structure shown in FIG. 11 after forming a functional gate structure in the volume of the gate cavity 34E; FIG. 12B shows the exemplary structure shown in FIG. 12A and through cut Y-Y shown in FIG. 1. The functional gate structure includes at least a gate dielectric material layer 36 and a gate electrode 38. The functional gate structure wraps around each semiconductor channel material nanosheet 16NS within the vertical nanosheet stack NS of now suspended semiconductor channel material nanosheets 16NS. As is known, the gate dielectric material layer 36 of the functional gate structure is in direct contact with physically exposed portions of each semiconductor channel material nanosheet 16NS, and the gate electrode 38 is located on the gate dielectric material layer 36. In some embodiments, the functional gate structure includes a work function metal (WFM) layer (not shown) located between the gate dielectric material layer 36 and the gate electrode 38. In some embodiments, a gate cap 40 is located above a recessed functional gate structure, See, FIG. 12A. In other embodiments, the gate cap 40 is omitted.

The functional gate structure includes forming a continuous layer of gate dielectric material and a gate electrode material inside and outside the gate cavity 34E. The continuous layer of gate dielectric material can include silicon oxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb(Sc,Ta)$O_3$), and/or lead zinc niobite (Pb(Zn,Nb)O). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide (TaCx), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM (work function metal) can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, chemical mechanical polishing (CMP), is used to remove the continuous layer of the gate dielectric material, the optional layer of WFM and the gate electrode material from outside the gate cavity 34E. The remaining continuous layer of the gate dielectric material that is present inside the gate cavity 34E can be referred to as a gate dielectric material layer, the remaining optional layer of WFM that is present inside the gate cavity can be referred to a WFM layer, and remaining gate electrode material that is present inside the gate cavity 34E provides a gate electrode. When present, gate cap 40 can be composed of a hard mask material such as, for example, silicon dioxide or silicon nitride. The gate cap 40 can be formed by a deposition process, followed by a planarization process.

In the illustrated embodiment shown in FIG. 12A, the gate cap 40 has a topmost surface that is coplanar with a topmost surface of both the dielectric spacer 20 and the ILD material layer 30. In other embodiments, the functional gate structure has a topmost surface that is coplanar with a topmost surface of both the dielectric spacer 20 and the ILD material layer 30. Note that in FIG. 12B, the ILD material layer 30 contacts a topmost surface of the STI structure 11. The STI structure 11 and the ILD material layer 30 can be composed of a compositionally same dielectric material, or compositionally different dielectric materials.

Figure 13A:
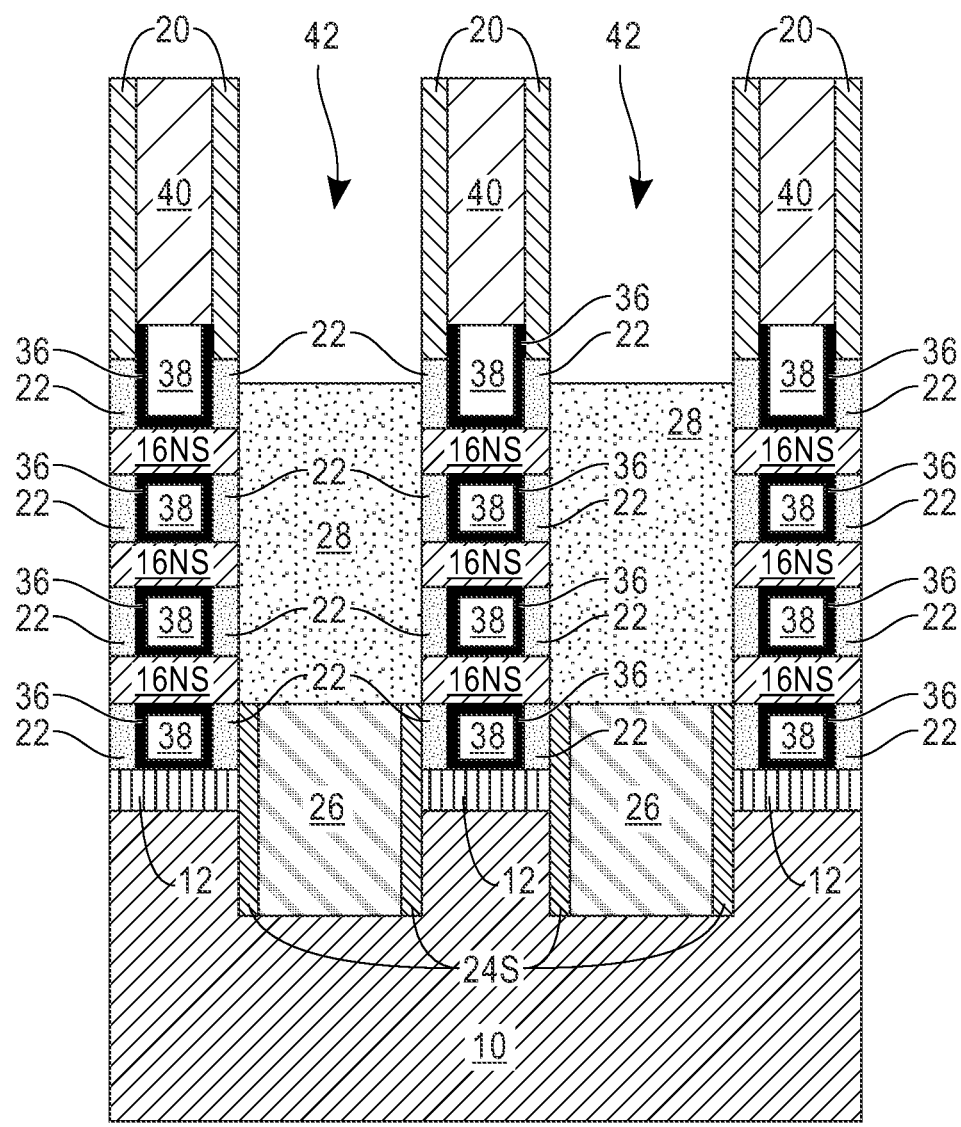
FIGS. 13A and 13B are cross sectional views of the exemplary structure shown in FIGS. 12A and 12B, respectively, after removing the interlayer dielectric material layer to reveal the source/drain region.
Figure 13B:
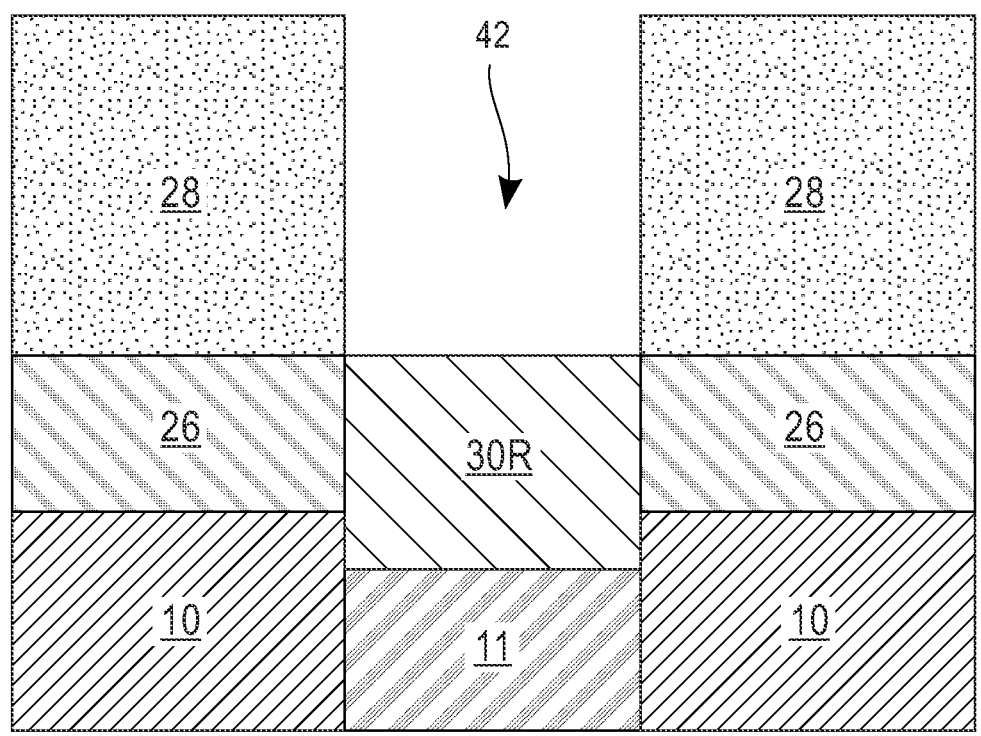

Referring now to FIGS. 13A and 13B, there are illustrated the exemplary structure shown in FIGS. 12A and 12B, respectively, after removing the ILD material layer 30 to reveal the source/drain region 28. Notably, the removal of the ILD material layer 30 includes a recess etch that reduces the height of the ILD material layer 30 such that the remaining recessed ILD material layer 30R has a topmost surface that is substantially coplanar with a topmost surface of the sacrificial semiconductor material layer. This recess etch is selective in removing the dielectric material that provides ILD material layer 30. A topmost surface and a sidewall surface of the source/drain region 32 are physically exposed after this recess etch.

Figure 14A:
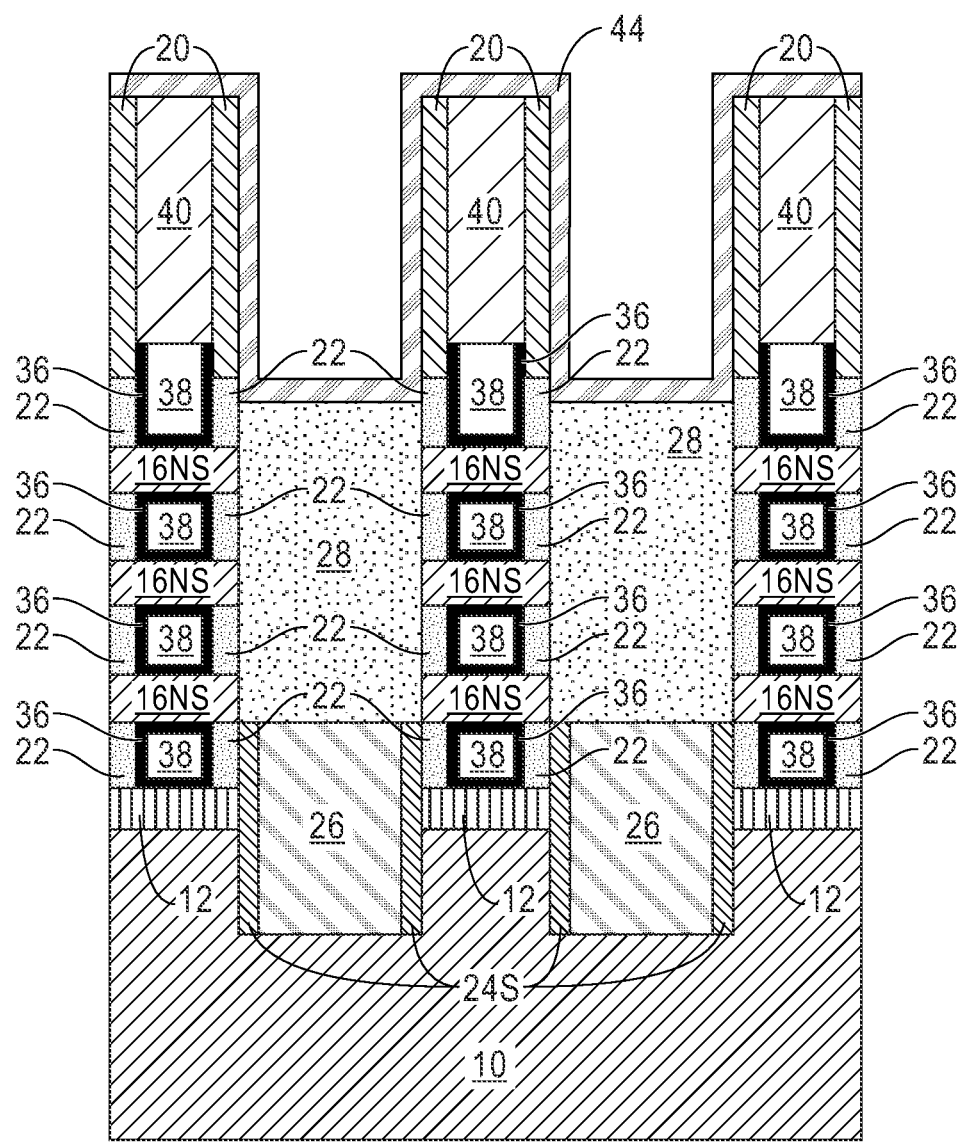
FIGS. 14A and 14B are cross sectional views of the exemplary structure shown in FIGS. 13A and 13B, respectively, after forming a metal liner on a topmost surface and along a sidewall surface of the source/drain region.
Figure 14B:
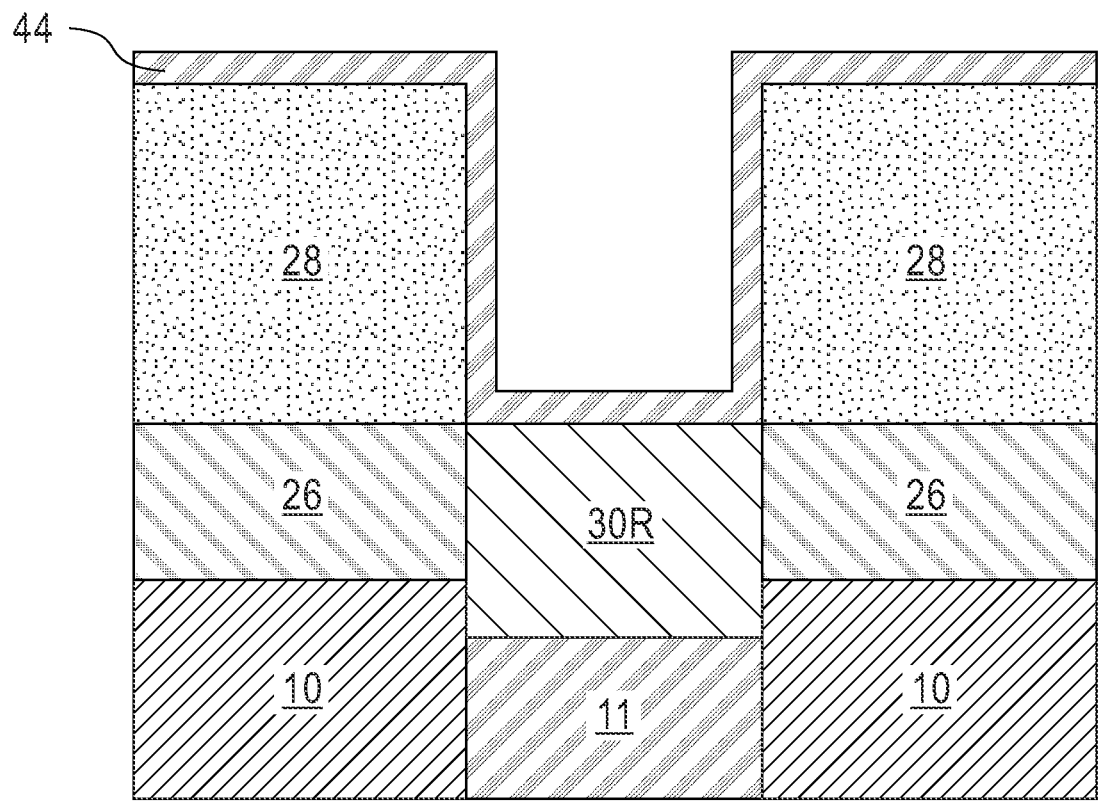

Referring now to FIGS. 14A and 14B, there are illustrated the exemplary structure shown in FIGS. 13A and 13B, respectively, after forming a metal liner 44 on a topmost surface and along a sidewall surface of the source/drain region 32. The metal liner 44 is also formed on a topmost surface of the recessed ILD material layer 30R and atop the functional gate structure (or the gate cap 40). The metal liner 44 is a continuous conformal layer. The metal liner 44 can be composed of TiN, TaN, W or combinations thereof. The metal liner 44 can be formed by a deposition process including, for example, CVD, PECVD, PVD or ALD. The metal liner 44 can have a thickness from 1 nm to 20 nm; although other thicknesses are contemplated and can be used as the thickness of the metal liner 44. The thickness of the metal liner 44 should not be sufficiently thick enough to entirely fill in the gap that is located between the source/drain region 28 of one nanosheet device (see, for example, the far left hand side of FIG. 14B) and the source/drain region 28 of another nanosheet device (see, for example, the far right hand side of FIG. 14B).

Figure 15A:
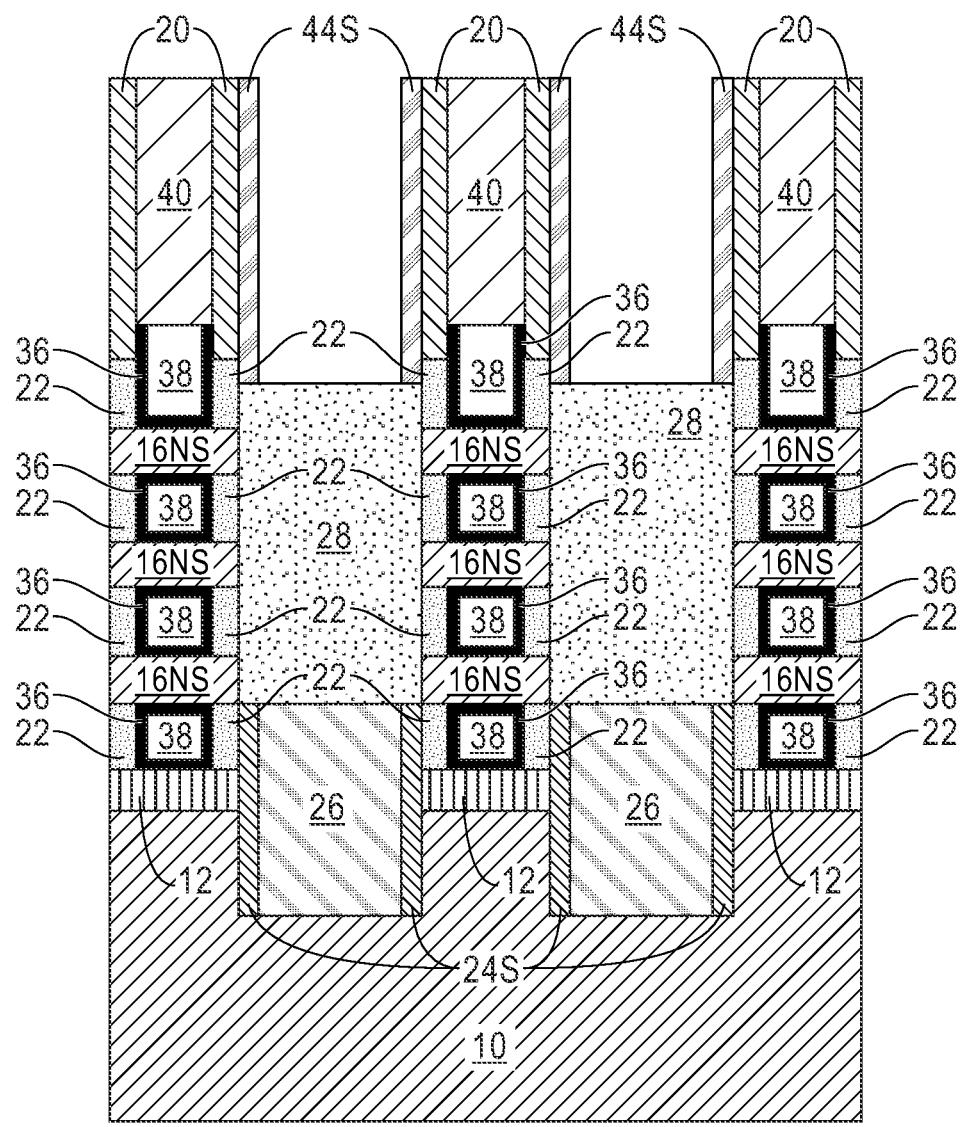
FIGS. 15A and 15B are cross sectional views of the exemplary structure shown in FIGS. 14A and 14B, respectively, after removing the metal liner from all horizontal surfaces.
Figure 15B:
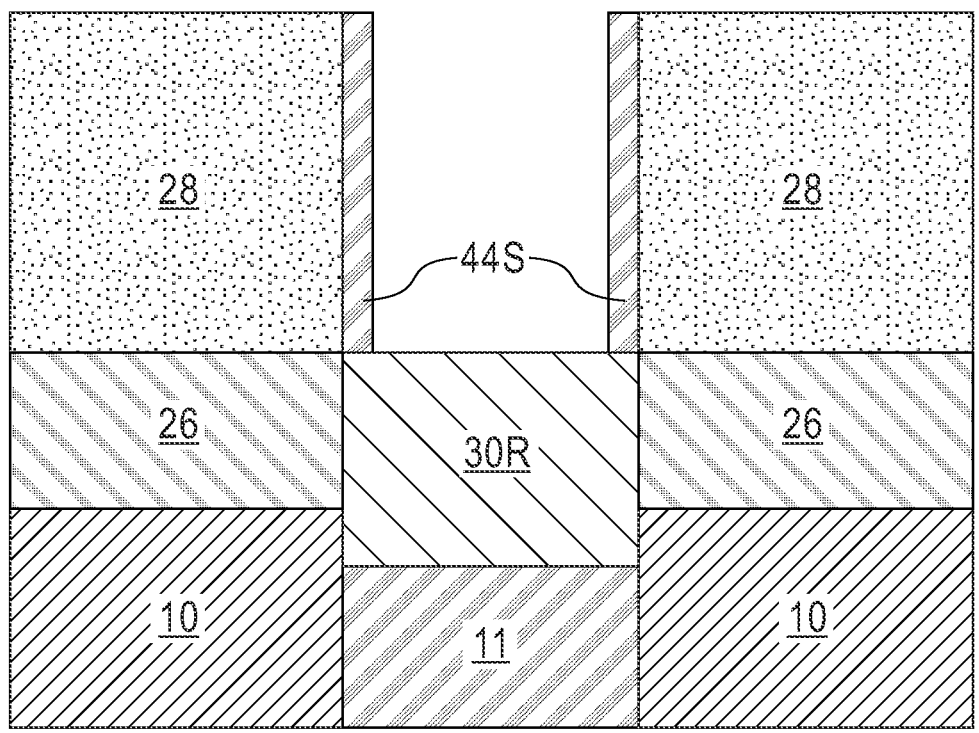

Referring now to FIGS. 15A and 15B, there are illustrated the exemplary structure shown in FIGS. 14A and 14B, respectively, after removing the metal liner 44 from all horizontal surfaces. The metal liner 44 remains along the vertical sidewalls of the source/drain region 28. The metal liner 44 also remains laterally adjacent to the sidewalls of gate cap 40, if present, or an upper portion of the functional gate structure if the gate cap 40 is not present. The remaining metal liner 44 can be referred to as a metal spacer 44S. The metal spacer 44S is I-shape. As shown in FIG. 15B, the metal spacer 44S in that region of the structure has a bottommost surface located on a surface of the recessed ILD material layer 30R and a topmost surface that is typically coplanar with a topmost surface of the source/drain region 28. The removal of the metal liner 44 from all horizontal surfaces include a self-aligned etch that is selective in removing the material that provides the metal liner 44. In one example, the self-aligned etch can include anisotropic etch.

Figure 16A:
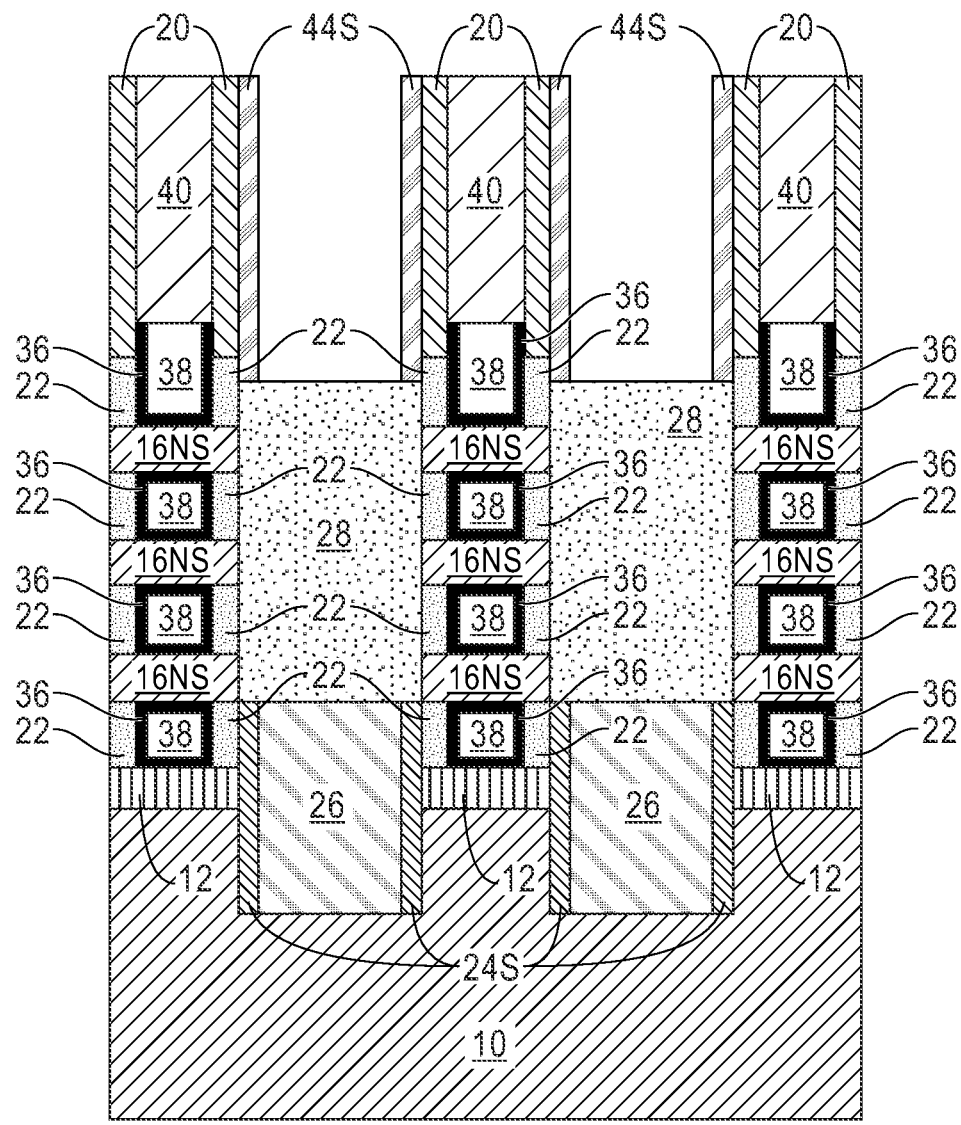
FIGS. 16A and 16B are cross sectional views of the exemplary structure shown in FIGS. 15A and 15B, respectively, after recessing the remaining interlayer dielectric material layer to provide an opening that physically exposes a sidewall of the sacrificial semiconductor material layer.
Figure 16B:
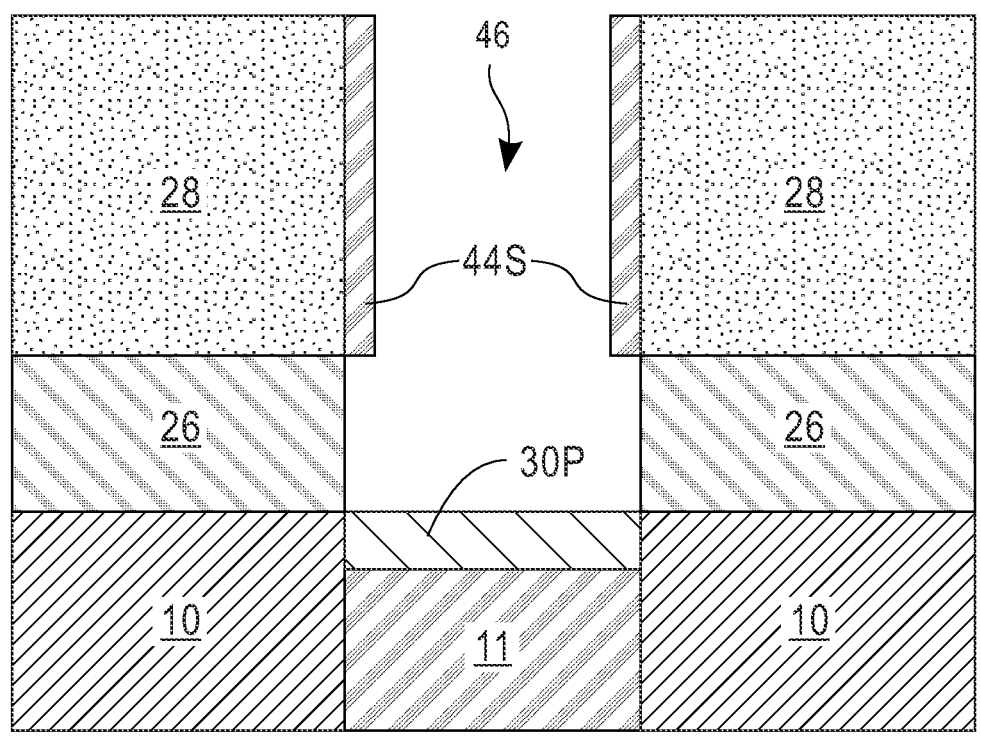

Referring now to FIGS. 16A and 16B, there are illustrated the exemplary structure shown in FIGS. 15A and 15B, respectively, after recessing the remaining interlayer dielectric material layer (i.e., recessed ILD material layer 30R) to provide an opening 46 that physically exposes a sidewall of the sacrificial semiconductor material layer 28. In some embodiments, the recessing stops on a sub-surface of the recessed ILD material layer 30R. In such an embodiment, the twice recessed ILD material layer 30P that remains after this recessing step has a topmost surface that is substantially coplanar (within ±10%) with a topmost surface of semiconductor substrate 10. In other embodiments (not shown), the recess stops on a topmost surface of the STI structure 11. The recessing of the previously recessed interlayer dielectric material layer 30R can include a recess etch that is selective in removing the dielectric material that provides the ILD material layer 30.

Figure 17A:
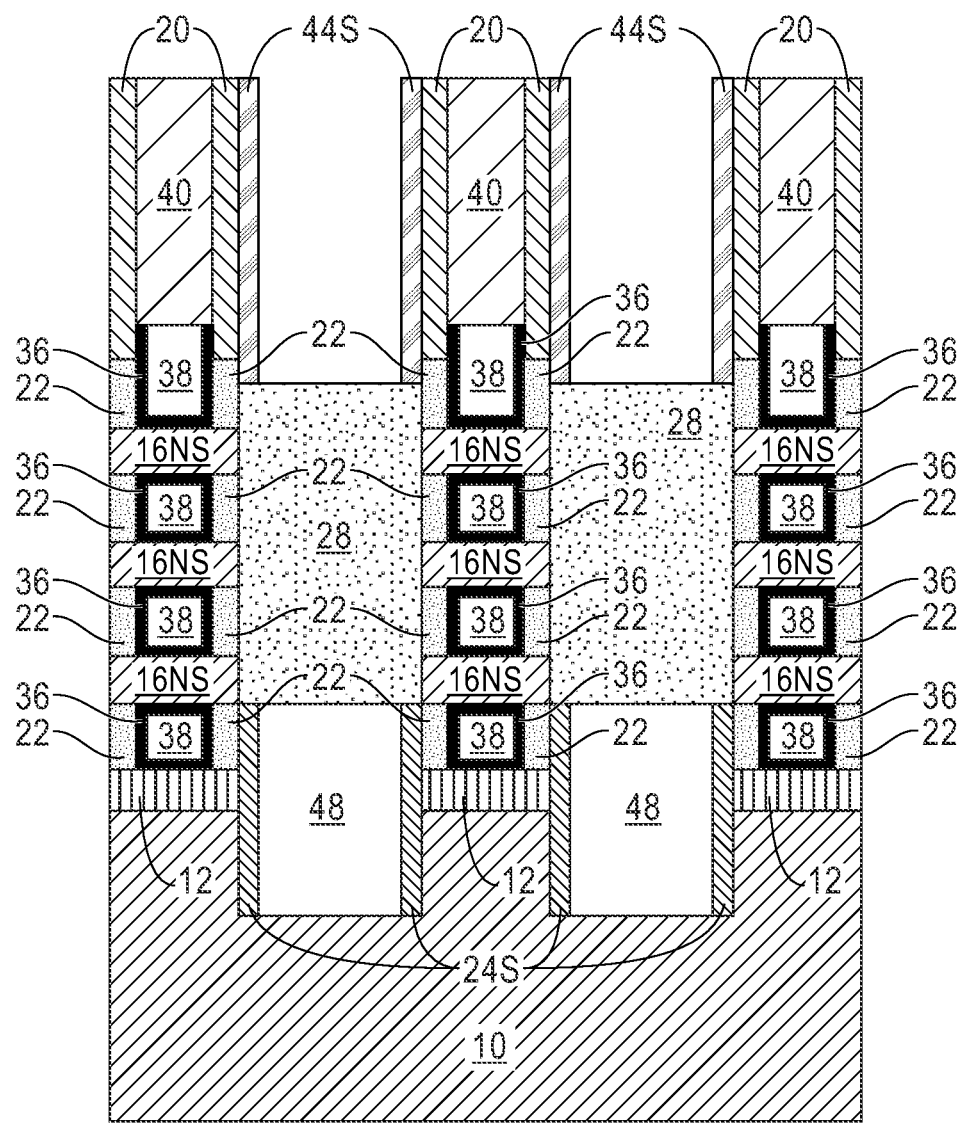
FIGS. 17A and 17B are cross sectional views of the exemplary structure shown in FIGS. 16A and 16B, respectively, after removing the sacrificial semiconductor material layer to form a horizontal cavity beneath the source/drain region.
Figure 17B:
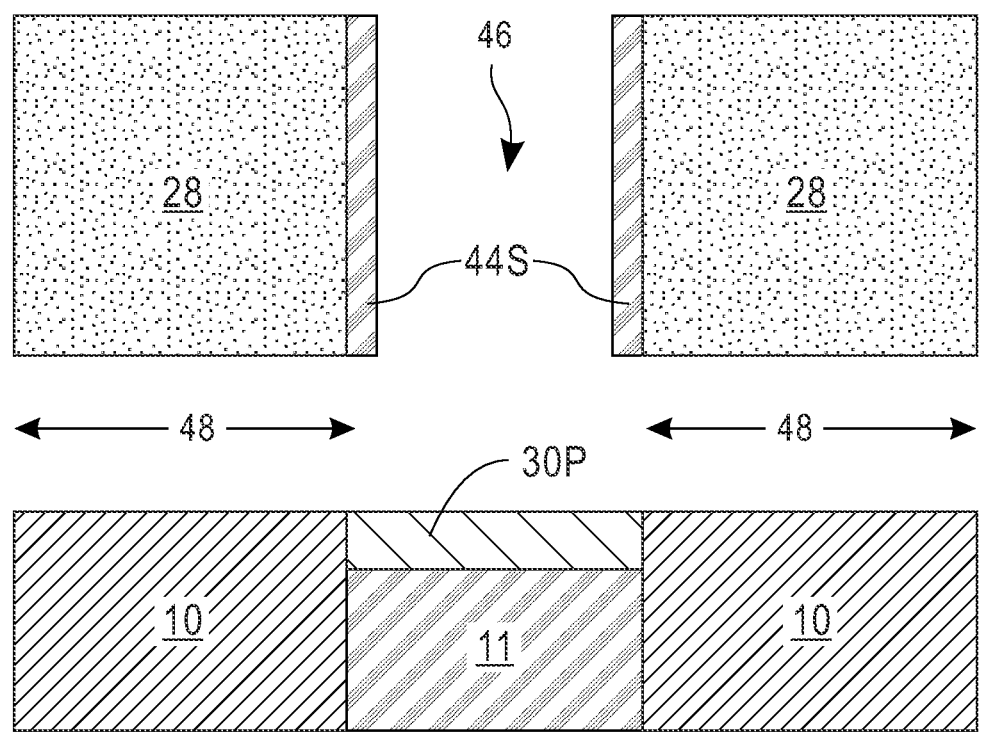

Referring now to FIGS. 17A and 17B, there are illustrated the exemplary structure shown in FIGS. 16A and 16B, respectively, after removing the sacrificial semiconductor material layer 26 to form a horizontal cavity 48 beneath the source/drain region 28. The removal of the sacrificial semiconductor material layer 26 includes a lateral etching process that is selective in removing the semiconductor material that provides the sacrificial semiconductor material layer 26 relative to the semiconductor material that provides both the semiconductor substrate 10 and source/drain region 28. At this point of the present application, horizontal cavity 48 is connected to opening 46 as is shown, for example, in FIG. 17B.

Figure 18A:
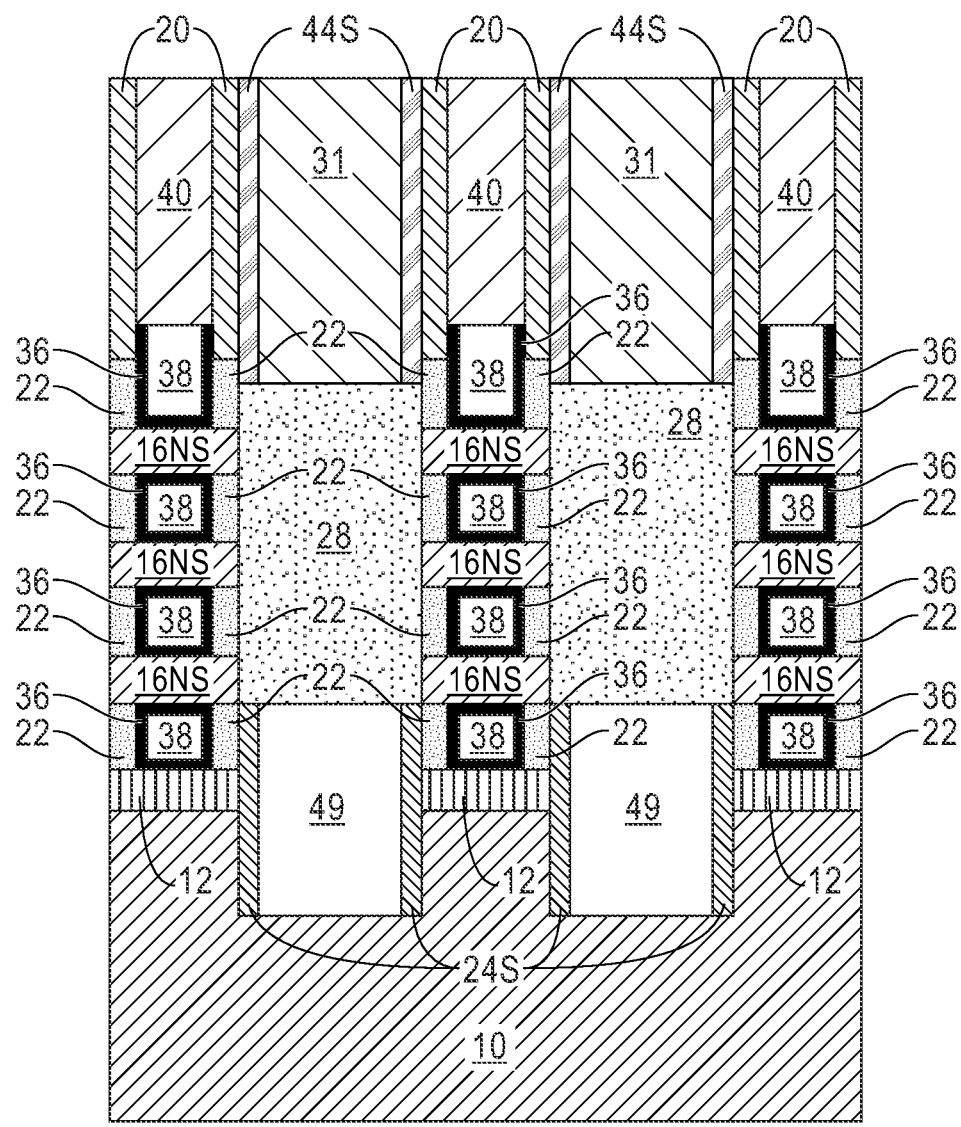
FIGS. 18A and 18B are cross sectional views of the exemplary structure shown in FIGS. 17A and 17B, respectively, after forming additional interlayer dielectric material laterally adjacent to, and above, the source/drain region, wherein the additional interlayer dielectric material fills in the opening and seals the horizontal cavity providing an air gap beneath the source/drain region.
Figure 18C:
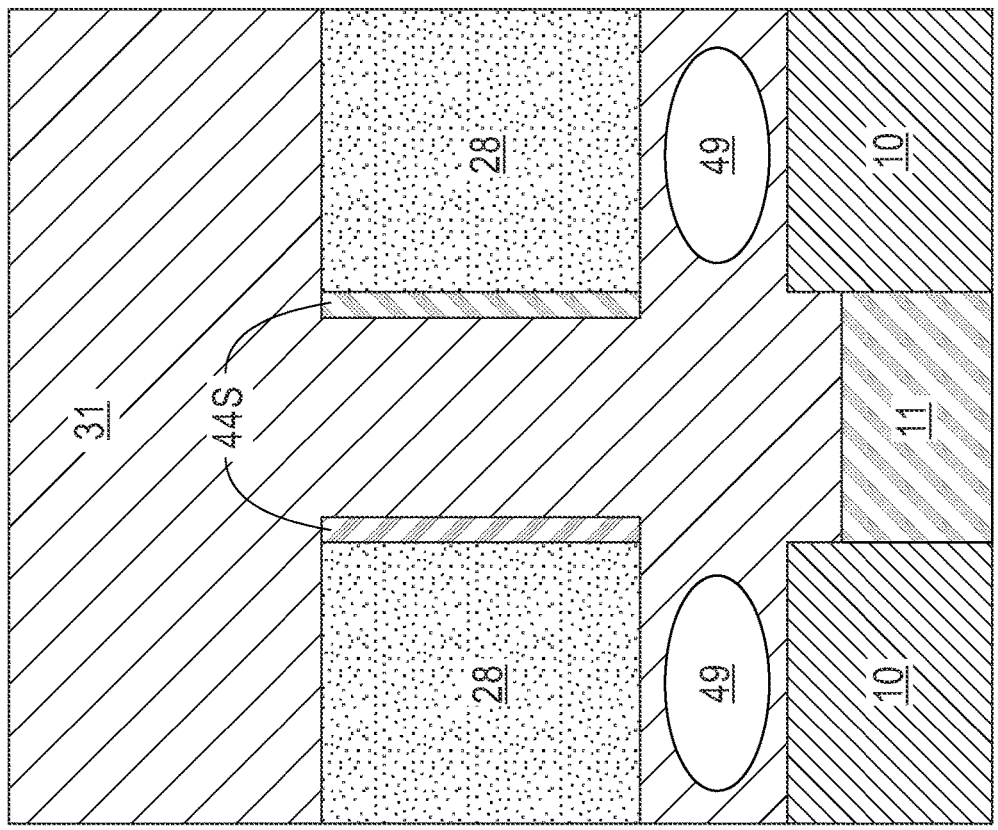
FIG. 18C is a cross sectional view of the exemplary structure shown in FIG. 17B after forming additional interlayer dielectric material laterally adjacent to, and above, the source/drain region, wherein the additional interlayer dielectric material fills in the opening and seals the horizontal cavity providing an air gap beneath the source/drain region in accordance with another embodiment of the present application.
Figure 18B:
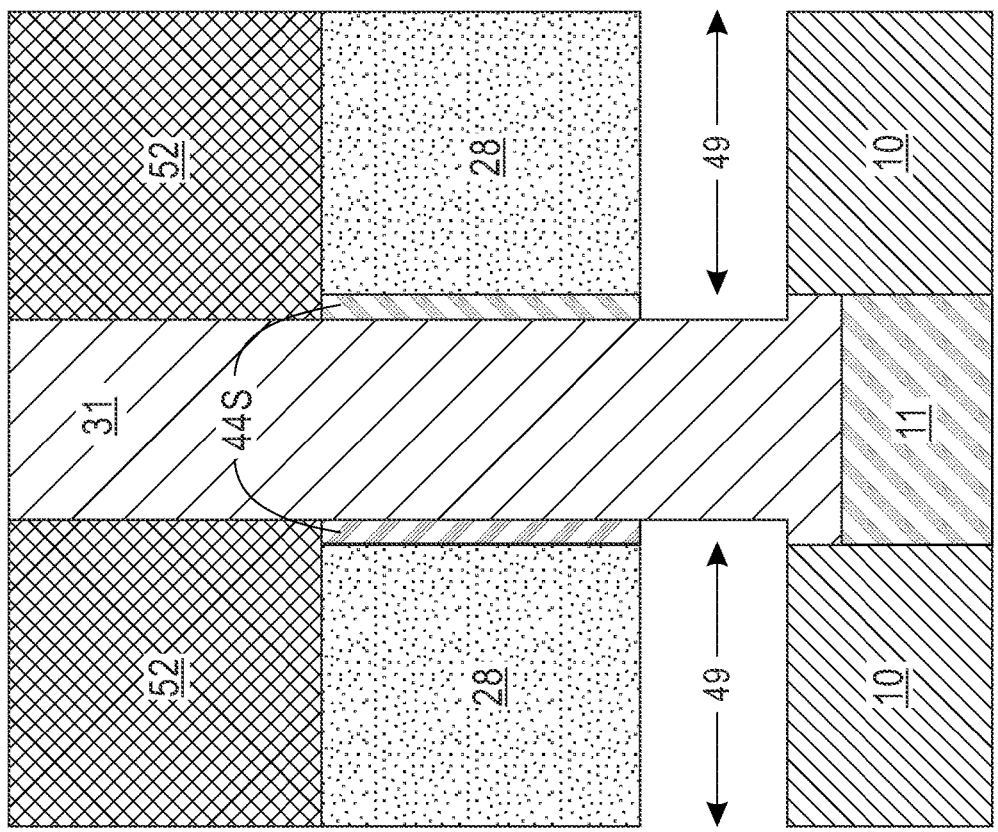

Referring now to FIGS. 18A and 18B, there are illustrated the exemplary structure shown in FIGS. 17A and 17B, respectively, after forming additional interlayer dielectric material laterally adjacent to, and above, the source/drain region 32, wherein the additional interlayer dielectric material fills in the opening 46 and seals the horizontal cavity 48 providing an air gap 49 beneath the source/drain region 32. FIG. 18C shows an alternative embodiment of the present application that can be formed. Air gap 49 is a void that includes air and does not include any solid or liquid material. In some embodiments, the additional interlayer dielectric material is formed on the twice recessed ILD material layer 30P. In other embodiments, the additional interlayer dielectric material is formed on the STI structure 11. In either embodiment, a ILD material-containing layer 31 is provided. The ILD material-containing layer 31 can include the twice recessed ILD material layer 30P and the additional interlayer dielectric material, or only the additional dielectric material layer. The additional interlayer dielectric material includes one of the dielectric materials mentioned above for ILD material layer 30. Typically, the additional interlayer dielectric material is compositionally the same as the dielectric material that provides ILD material layer 30. The additional ILD material can be formed utilizing one of the deposition processes mentioned above for forming the ILD material layer 30. In some instances (not illustrated here for the illustrated embodiment, but show in another embodiment of the present application, e.g. See, FIG. 25B), a vertical air gap can be present in a portion of the ILD material-containing layer 31 that is located between the source/drain regions of different device regions. This vertical air gap is typically located laterally adjacent to these source/drain regions. The vertical air gap forms during the deposition of the ILD material due to the tight space between adjacent device regions. Air gap 49 is typically a horizontal air gap. The term "vertical air gap" denotes an air gap whose height is greater than its width; the term "horizontal air gap" denotes an air gap whose length is greater than its height.

In some embodiments, and as is shown in FIG. 18B, the ILD material-containing layer 31 does not extend beneath the source/drain region 28. In such an embodiment, the air gap 49 has an outer boundary defined by the ILD material-containing layer 31 and the air gap 49 directly contacts a bottommost surface of the source/drain region 28 and a topmost surface of the semiconductor substrate 10. In other embodiments, and as is shown in FIG. 18C, the ILD material-containing layer extends beneath the source/drain region 28 and is present between a bottommost surface of the source/drain region 28 and the air gap 49, and between a topmost surface of the semiconductor substrate 10 and the air gap 49. In this embodiment, air gap 49 is surrounded by the ILD material-containing layer 31.

Figure 19A:
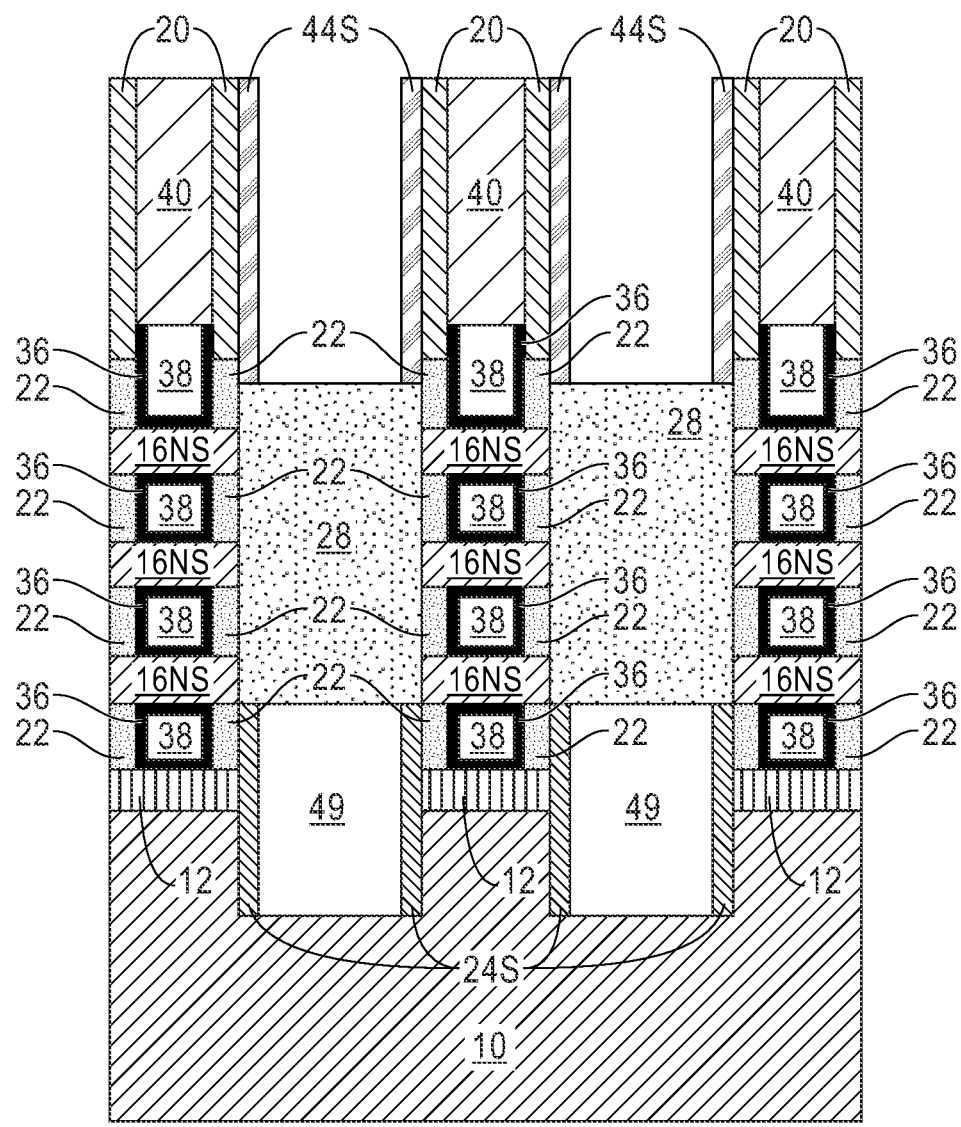
FIGS. 19A and 19B are cross sectional views of the exemplary structure shown in FIGS. 18A and 18B, respectively, after removing the additional interlayer dielectric material from a topmost surface of the source/drain region.
Figure 19B:
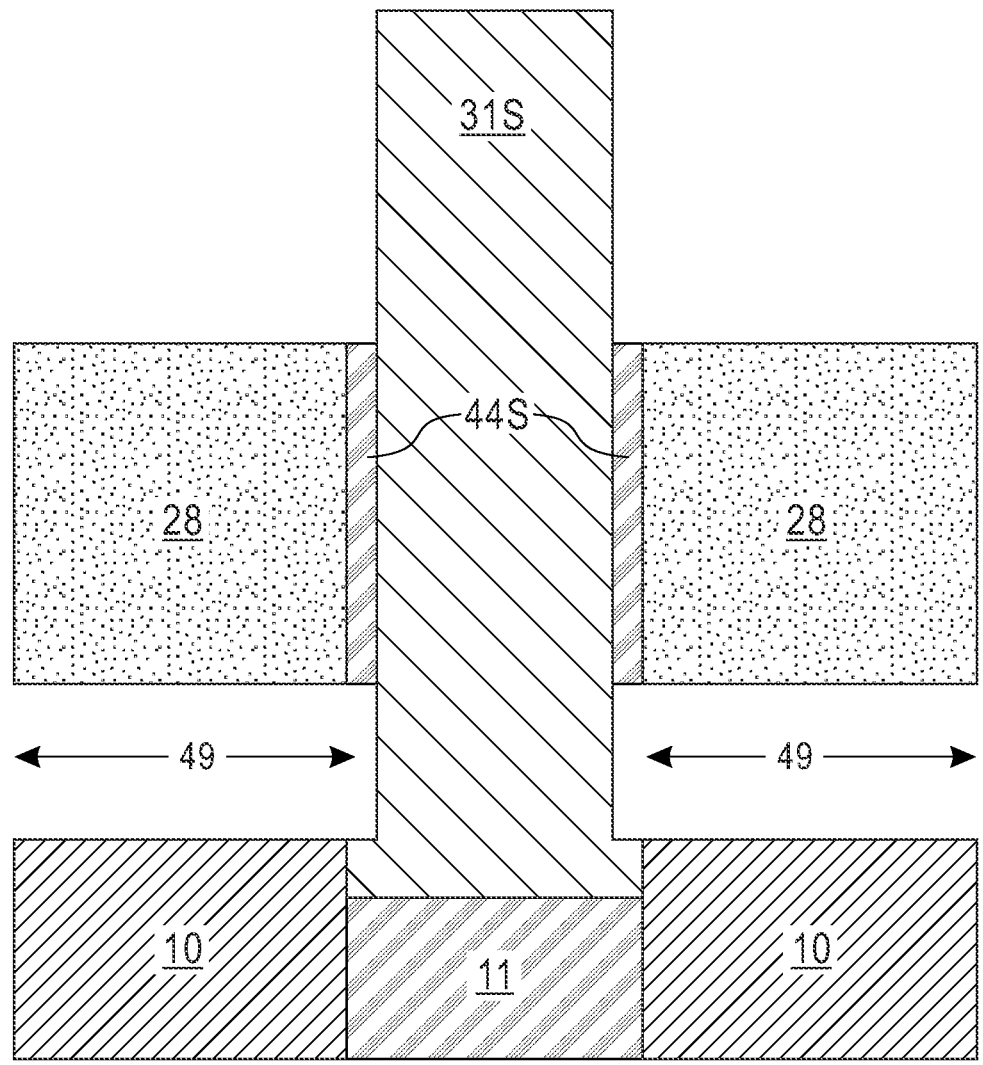

Referring now to FIGS. 19A and 19B, there are illustrated the exemplary structure shown in FIGS. 18A and 18B, respectively, after removing the additional interlayer dielectric material (i.e., ILD material-containing layer 31) from a topmost surface of the source/drain region 28. The removal of the ILD material-containing layer 31 from a topmost surface of the source/drain region 28 includes an etching process such as, for example, a reactive ion etch. This etch provides ILD material-containing structure 31S that is located laterally adjacent to the source/drain region 28. The ILD material-containing structure 31S provides isolation between different device regions as is shown, for example, in FIG. 19B.

Figure 20A:
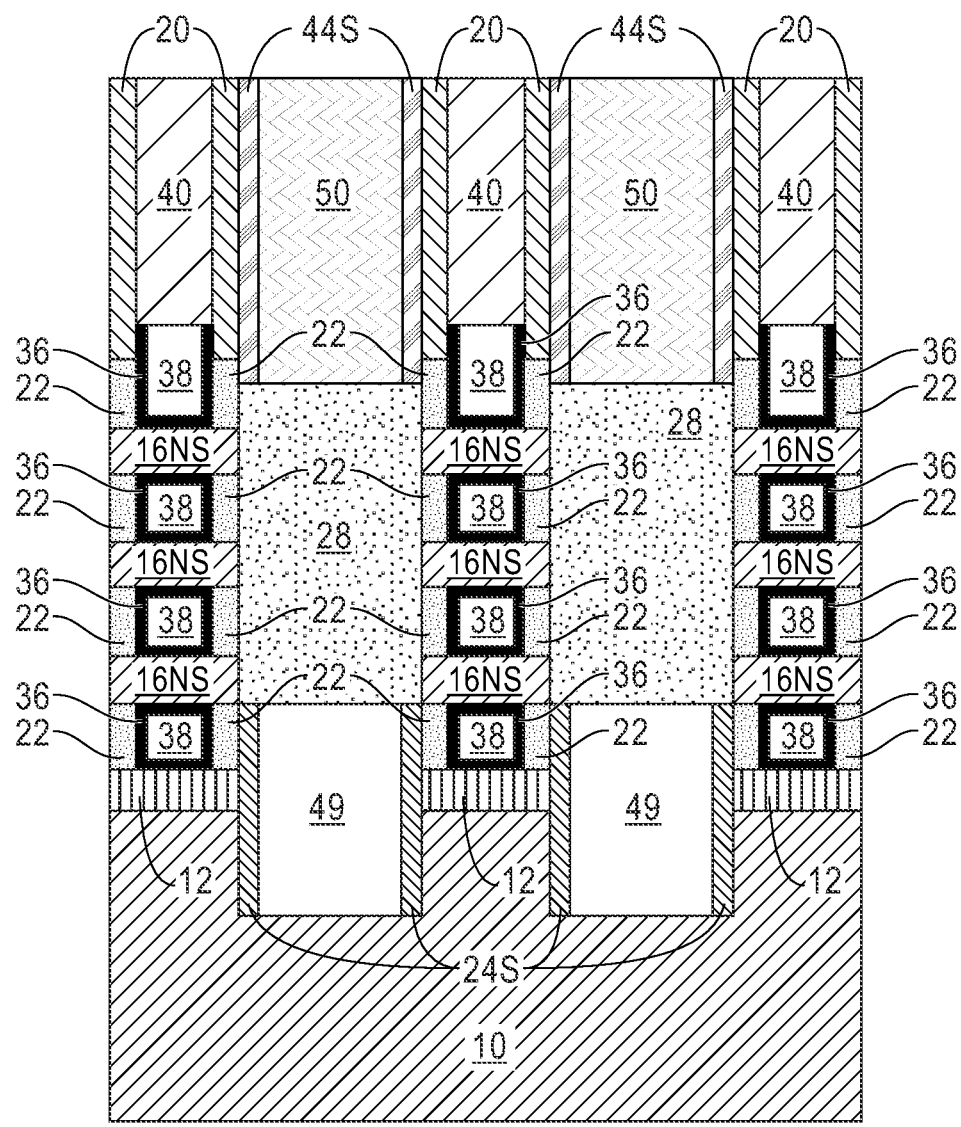
FIGS. 20A and 20B are cross sectional views of the exemplary structure shown in FIGS. 19A and 19B, respectively, after forming a source/drain contact structure on the topmost surface of the source/drain region.
Figure 20B:
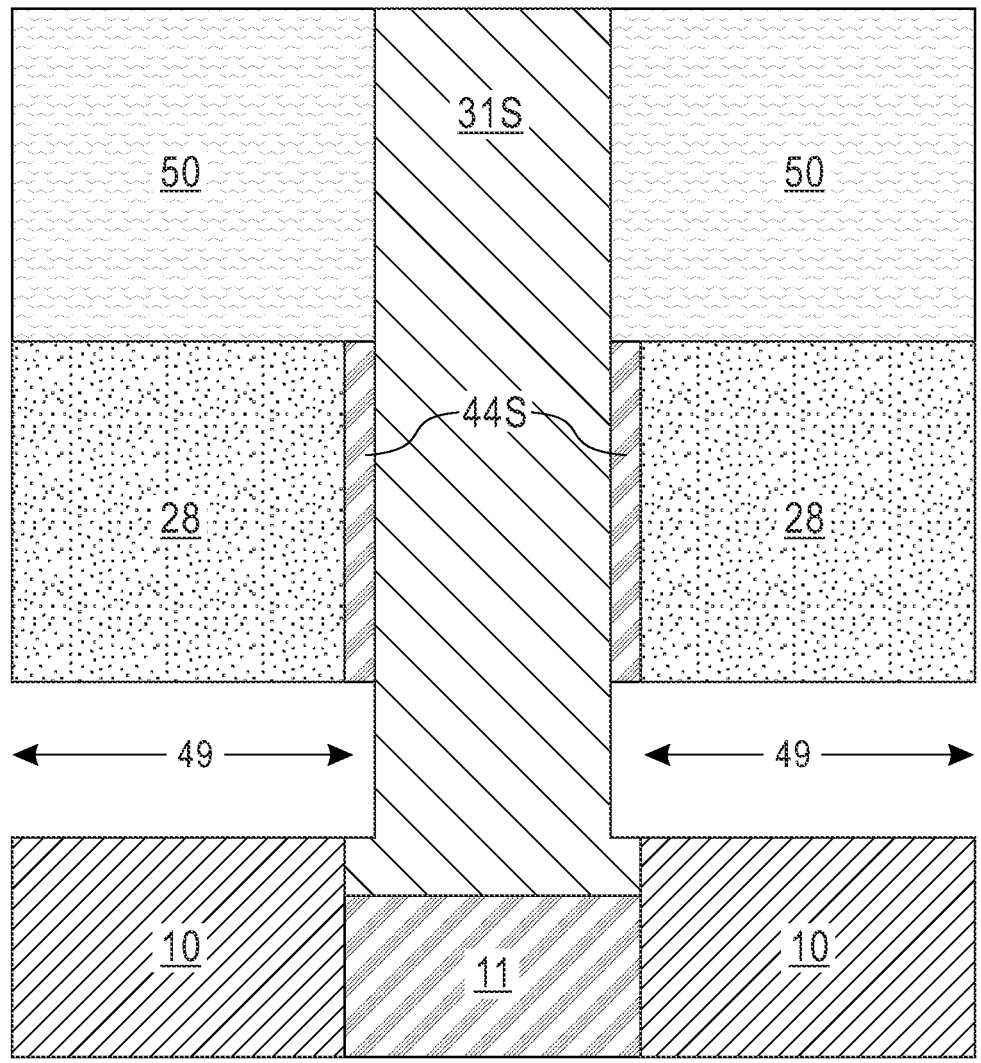

Referring now to FIGS. 20A and 20B, there are illustrated the exemplary structure shown in FIGS. 19A and 19B, respectively, after forming a source/drain contact structure 50 on the topmost surface of the source/drain region 32. The source/drain contact structure 50 is also formed laterally adjacent to the ILD material-containing structure 31S as is shown, for example, in FIG. 20B. In some embodiments (not shown), a contact liner can be present along the sidewalls and bottom wall of the source/drain contact structure 50. In one or more embodiments in which a contact liner is present, the contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, RFPVD, CVD or ALD. The contact liner that is formed can have a thickness ranging from 1 nm to 8 nm, although lesser and greater thicknesses can also be employed.

The source/drain contact structure 50 includes a contact conductor material such as, for example, W, Cu, Al, Co, Ru, Mo, Os, Ir, Rh or an alloy thereof. The contact conductor material can be formed by any suitable deposition method such as, for example, ALD, CVD, PVD or plating. A planarization process can be used to remove the contact conductor material and the contact liner (when provided) that are located above the ILD material-containing structure 31S. The remaining contact conductor material and if present, the contact liner provide the source/drain contact structure 50 shown in FIGS. 20A and 20B. In this embodiment, the source/drain contact structure 50 has a topmost surface that is coplanar with at least a topmost surface of the ILD material-containing structure 31S. In this embodiment, the metal spacer 44 is present along a sidewall, but not a bottom wall of, the source/drain contact structure as is shown, for example, in FIG. 20A.

FIGS. 20A-20B illustrate an exemplary semiconductor structure of the present application in which an air gap 49 is located beneath the source/drain region 28 of a nanosheet device that includes a functional gate structure 36, 38 wrapped around at least one suspended semiconductor channel material nanosheet 16NS. The air gap 49 does not extend beneath the functional gate structure 36, 38. Instead, bottom dielectric isolation layer 12 is located beneath the functional gate structure 36, 38 and the bottom dielectric isolation layer 12.

Figure 21A:
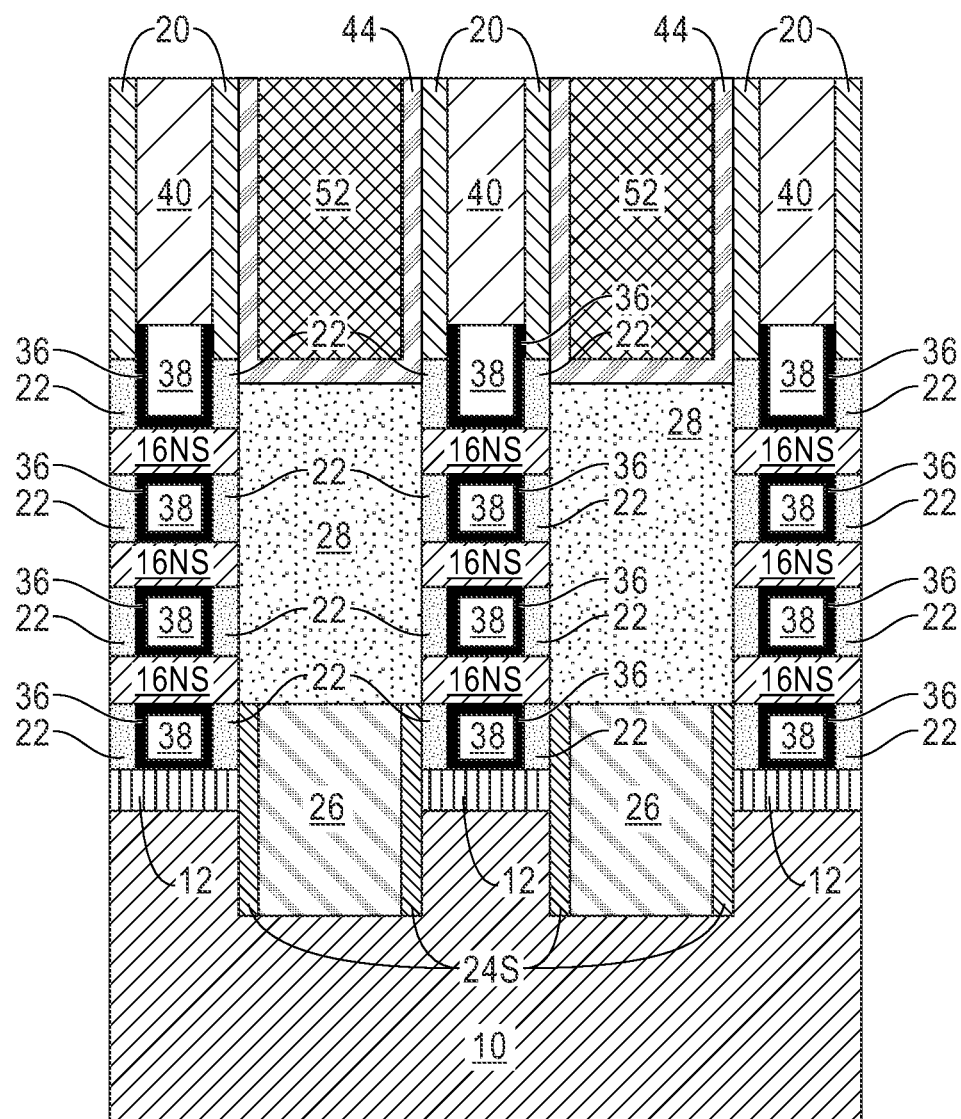
FIGS. 21A and 21B are cross sectional views of the exemplary structure shown in FIGS. 14A and 14B, respectively, after forming a hard mask on the metal liner, wherein the hard mask covers an entirety of the metal liner that is located on a topmost surface and along a sidewall of the source/drain region and a portion of the metal liner that is located on the remaining interlayer dielectric material layer.
Figure 21B:
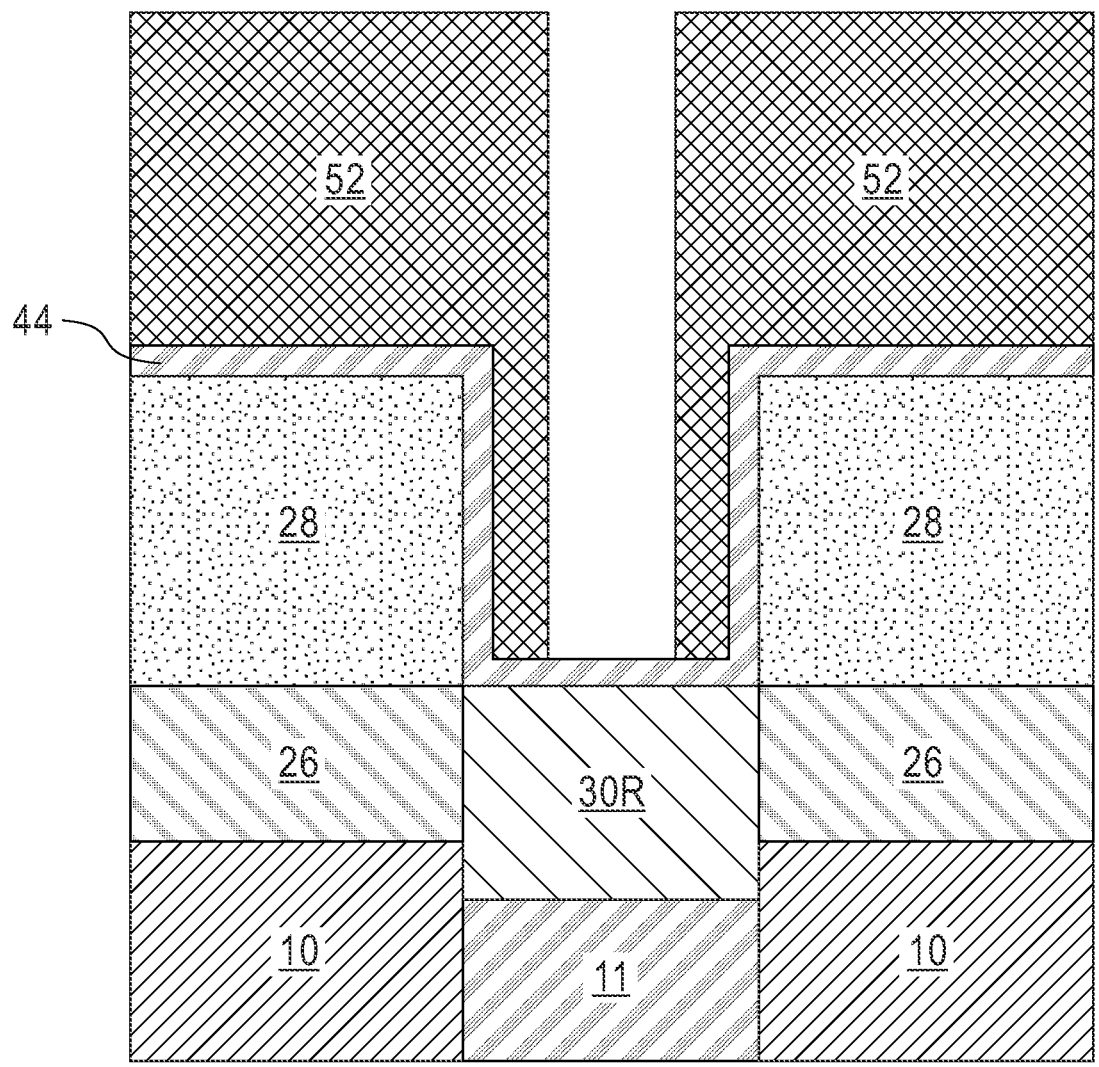

Referring now to FIGS. 21A and 21B, there are illustrated the exemplary structure shown in FIGS. 14A and 14B, respectively, after forming a hard mask 52 on the metal liner 44, wherein the hard mask 52 covers an entirety of the metal liner 44 that is located on a topmost surface and along a sidewall of the source/drain region 28 and a portion of the metal liner 44 that is located on the remaining ILD material layer 30 (i.e., recessed ILD material layer 30R). A portion of the metal liner 44 that is located above the recessed ILD material layer 30R is physically exposed and is not covered by the hard mask 52. Hard mask 52 includes any hard mask material such as, for example, silicon dioxide, silicon nitride or silicon oxynitride. The hard mask 52 can be formed by a deposition process, followed by lithographic patterning. The deposition process includes, but is not limited to, CVD, PECVD, PVD, or ALD. The lithography patterning process includes lithography (i.e., resist deposition, resist exposure, and resist development) and an etch. The etch is selectively in removing the hard mask material. The resist is removed after the etch used to pattern the hard mask material.

Figure 22A:
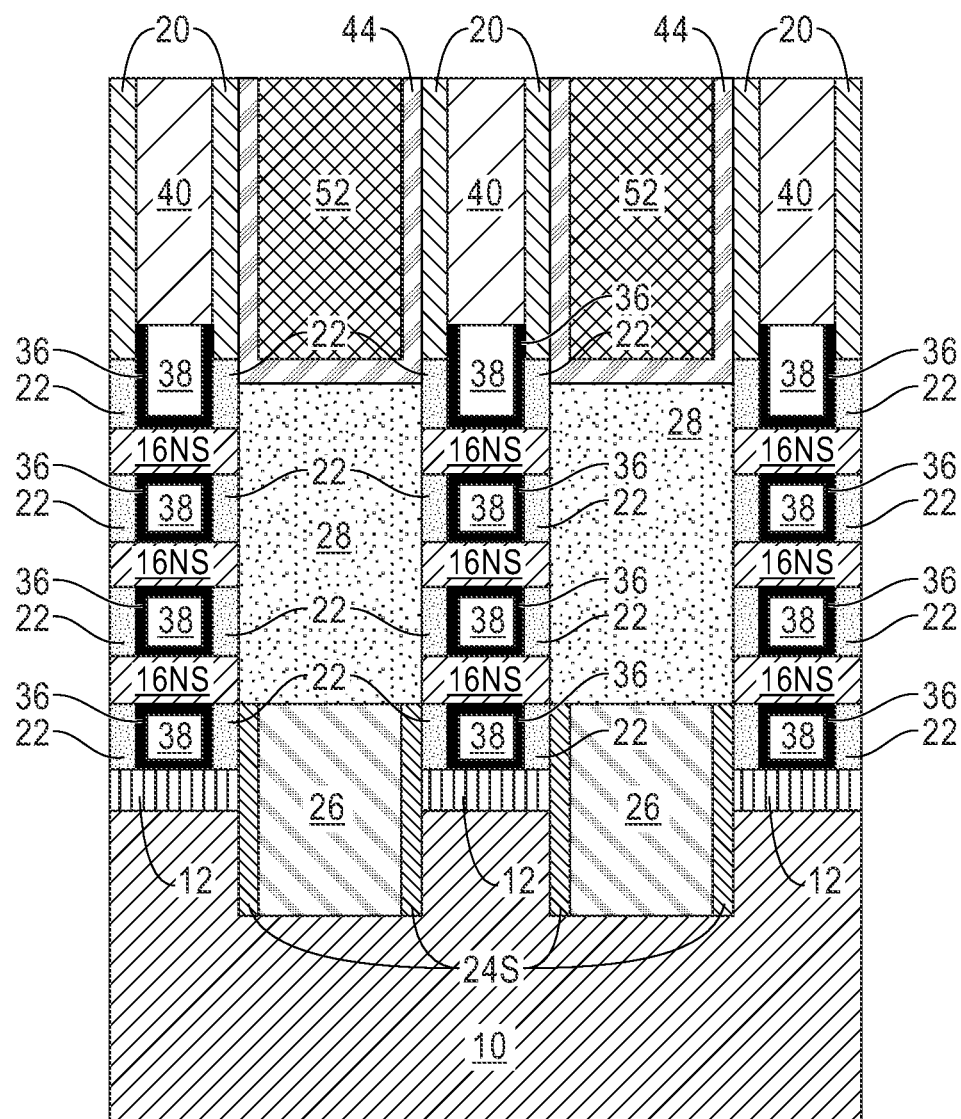
FIGS. 22A and 22B are cross sectional views of the exemplary structure shown in FIGS. 21A and 21B, respectively, after removing the hard mask that is present on the remaining interlayer dielectric material layer.
Figure 22B:
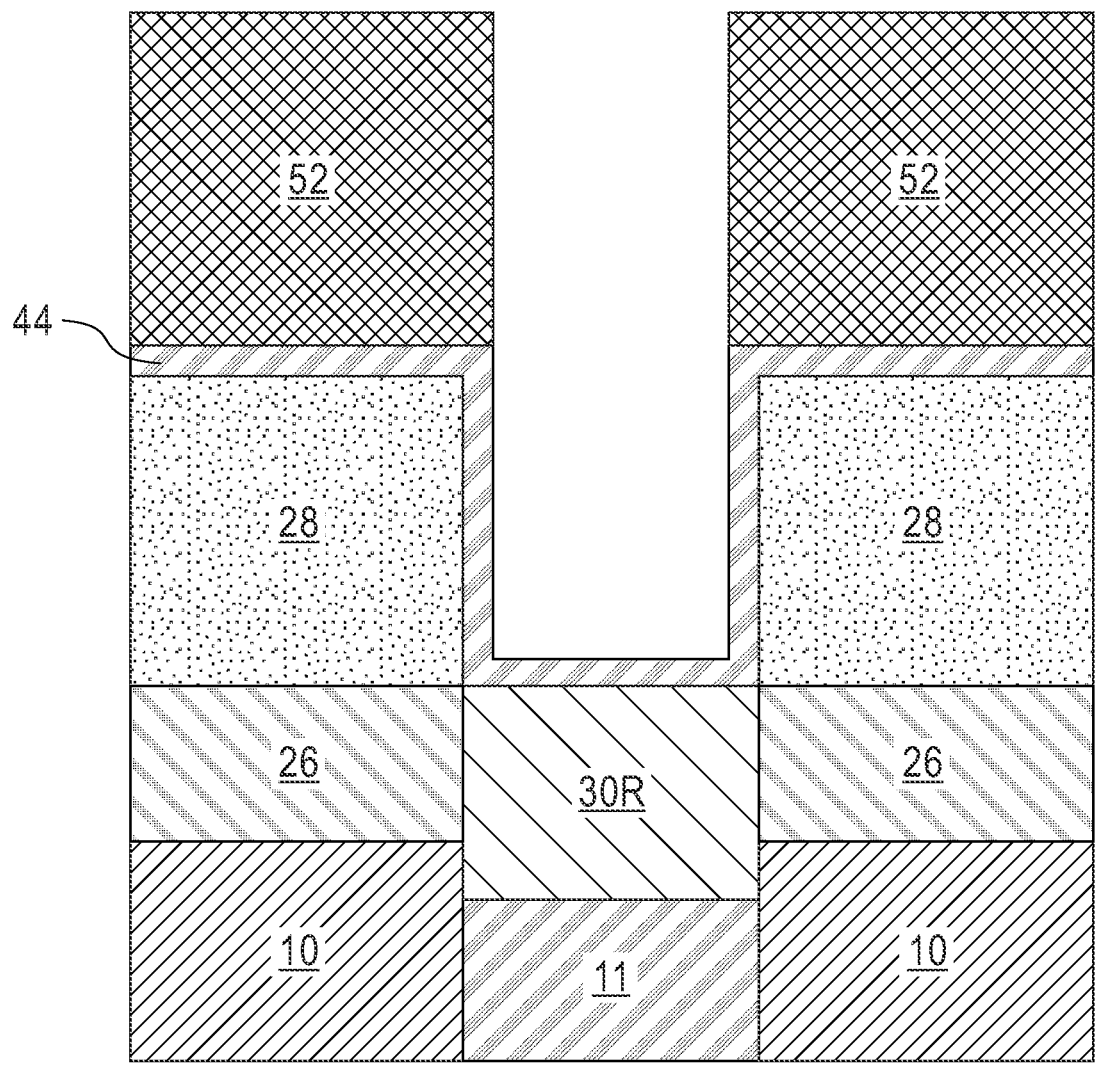

Referring now to FIGS. 22A and 22B, there are illustrated the exemplary structure shown in FIGS. 21A and 21B, respectively, after removing the hard mask 52 that is present on the top of the recessed ILD material layer 30R. The removal of the hard mask 52 that is on the top surface of the recessed ILD material layer 30R includes an etch back process. After performing the etch back process, the metal liner 44 on top of the recessed ILD material layer 30R is physically exposed as is shown in FIG. 22B.

Figure 23A:
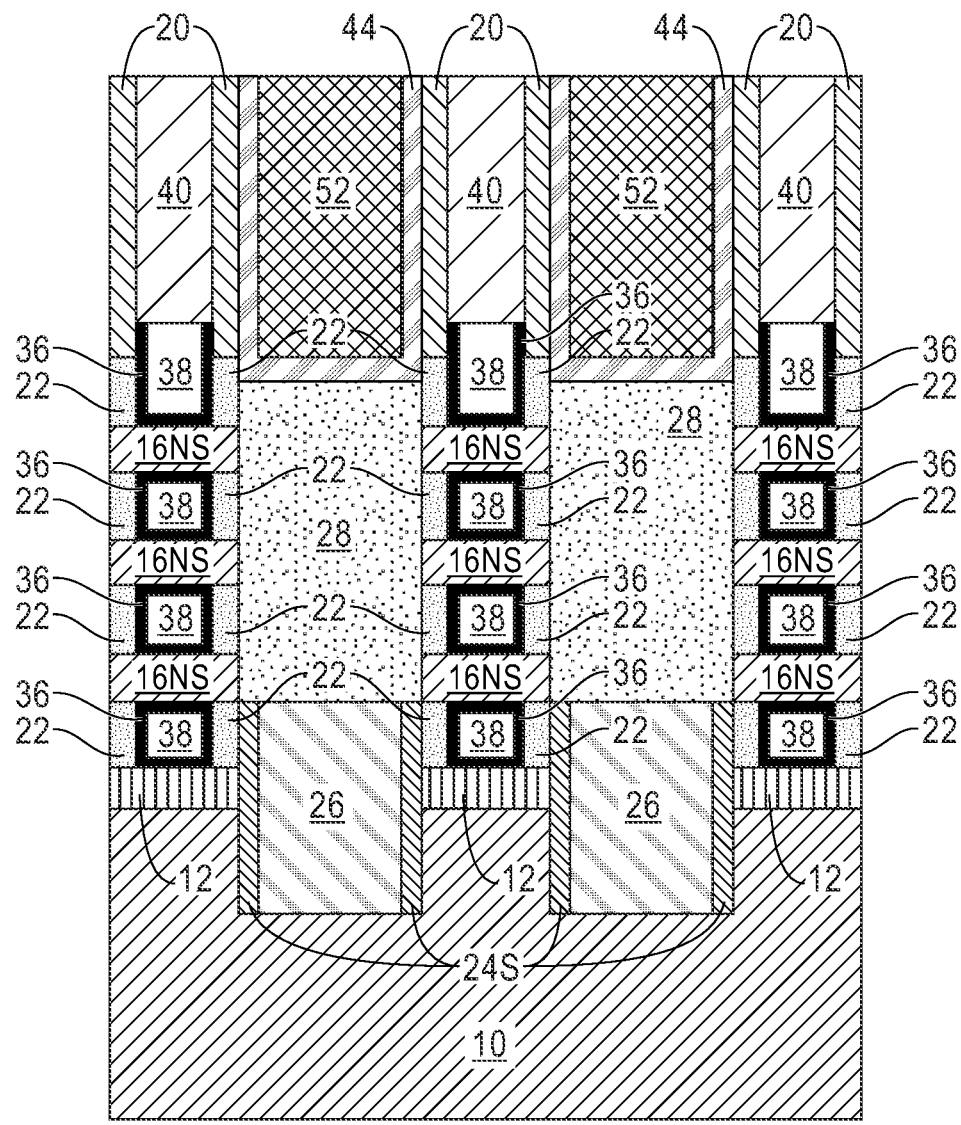
FIGS. 23A and 23B are cross sectional views of the exemplary structure shown in FIGS. 22A and 22B, respectively, after removing physically exposed portions of the metal liner and an upper portion of the recessed interlayer dielectric material layer to provide an opening that physically exposes a sidewall of the sacrificial semiconductor material layer.
Figure 23B:
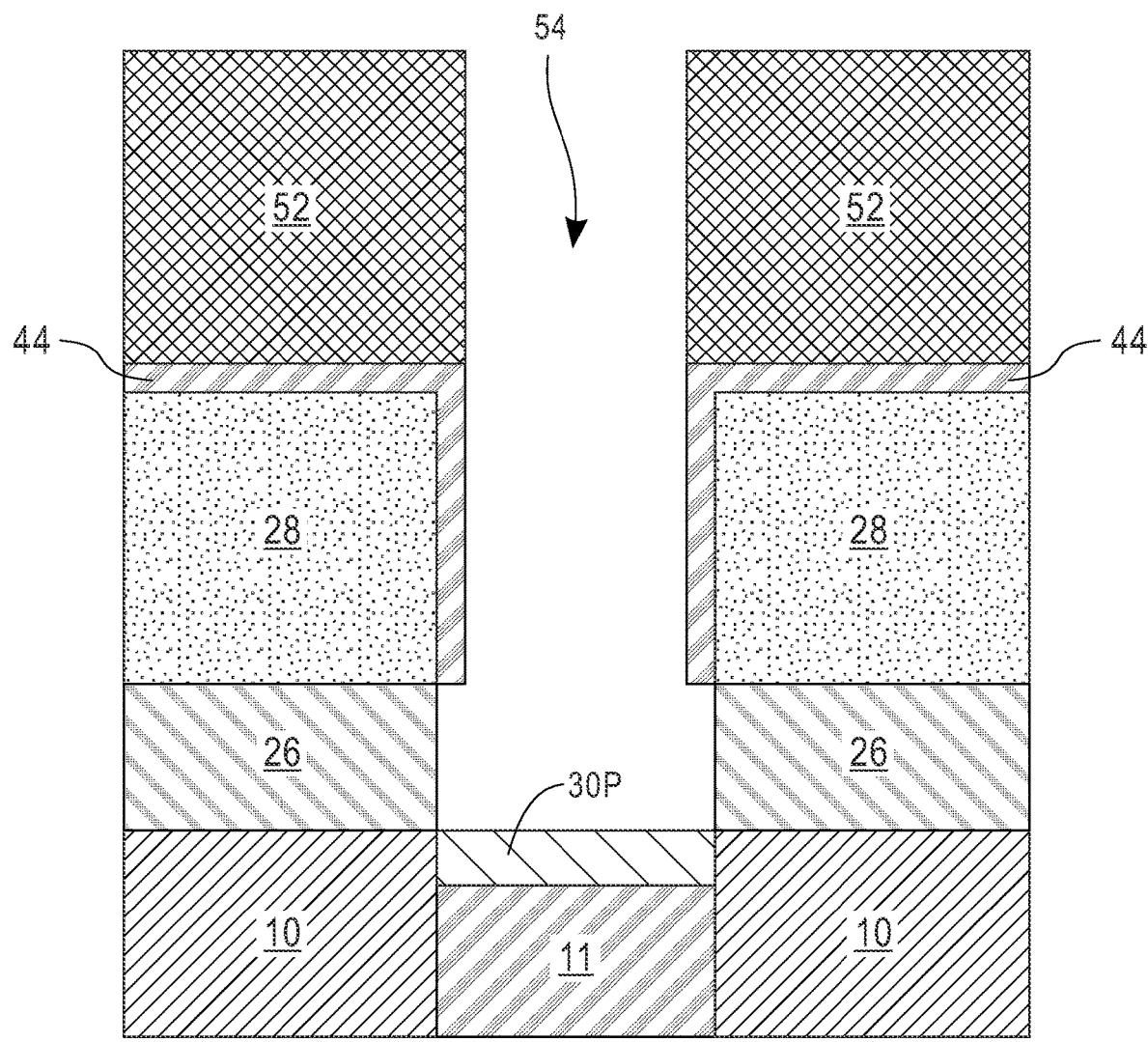

Referring now to FIGS. 23A and 23B, there are illustrated the exemplary structure shown in FIGS. 22A and 22B, respectively, after removing physically exposed portions of the metal liner 44 and an upper portion of the recessed interlayer dielectric material layer 30R to provide an opening 54 that physically exposes a sidewall of the sacrificial semiconductor material layer 26. The removal of the metal liner 44 includes a self-aligned metal etching process as previously mentioned above. In one example, the self-aligned metal etch includes a reactive ion etch. The recessed interlayer dielectric material layer 30R is then recessed utilizing a recess etch. This recess etch can entirely remove the recessed ILD material layer 30R (so as to physically expose the STI structure 11) or partially remove the recessed ILD material layer. In the partial removal embodiment, a portion of the recessed ILD material layer 30R (hereinafter twice recessed ILD material layer 30P can remain such that the twice recessed ILD material layer 30P) has a topmost surface that is substantially coplanar surface of the semiconductor substrate 10.

Figure 24A:
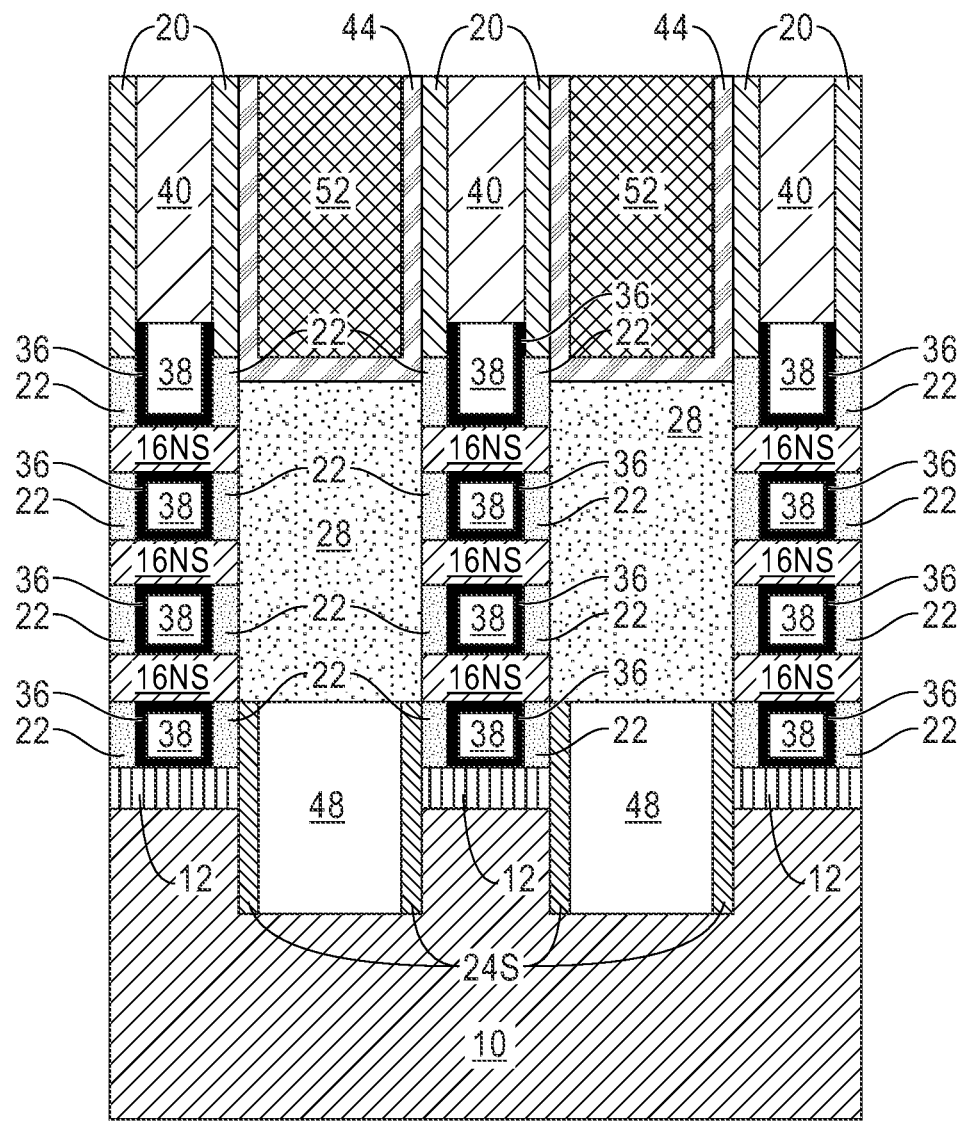
FIGS. 24A and 24B are cross sectional views of the exemplary structure shown in FIGS. 23A and 23B, respectively, after removing the sacrificial semiconductor material layer to form a horizontal cavity beneath the source/drain region.
Figure 24B:
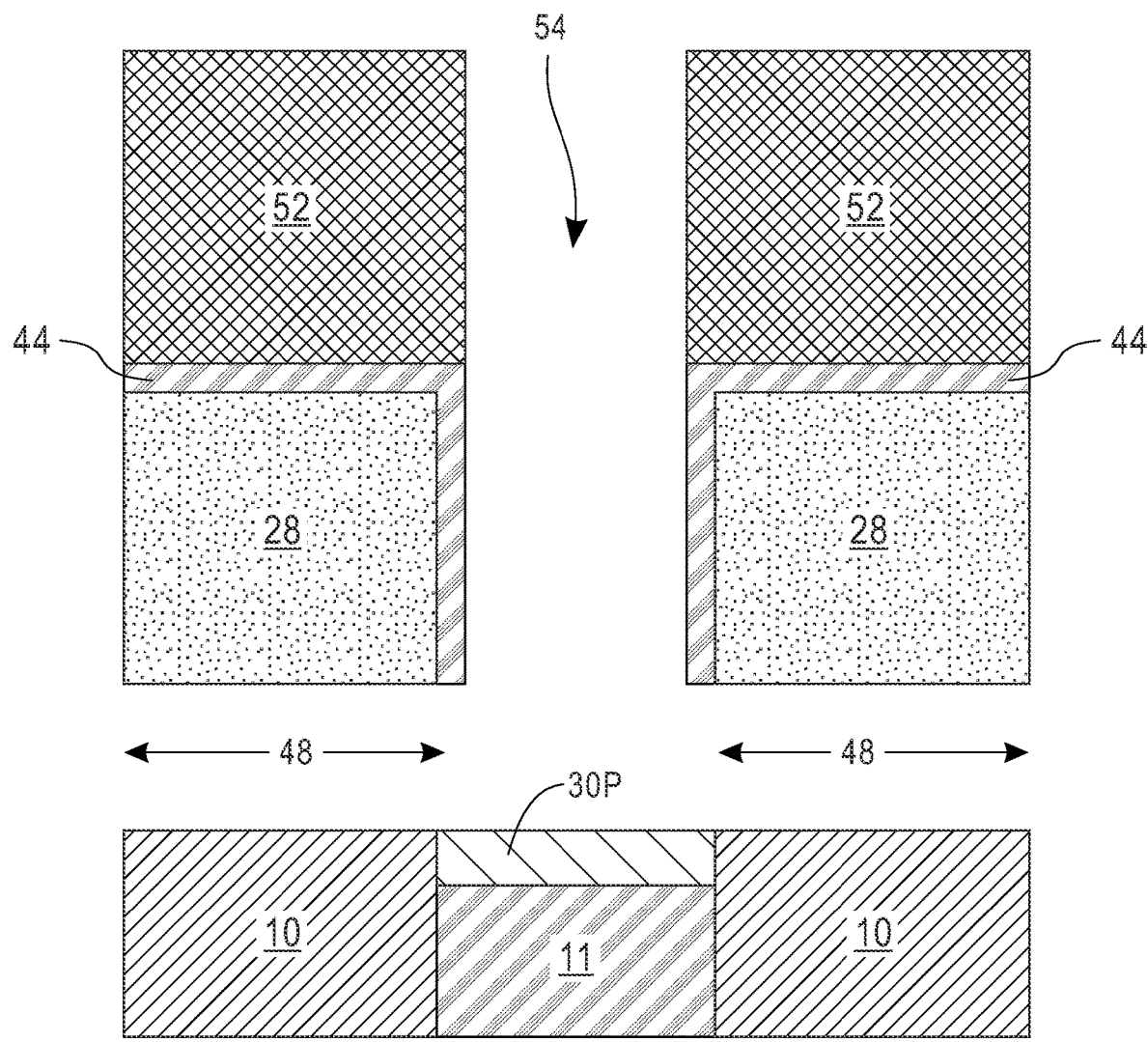

Referring now to FIGS. 24A and 24B, there are illustrated the exemplary structure shown in FIGS. 23A and 23B, respectively, after removing the sacrificial semiconductor material layer 26 to form a horizontal cavity 48 beneath the source/drain region 28. The removal of the sacrificial semiconductor material layer 26 includes a lateral etching process that is selective in removing the semiconductor material that provides the sacrificial semiconductor material layer 26 relative to the semiconductor material that provides both the semiconductor substrate 10 and source/drain region 28. At this point of the present application, horizontal cavity 48 is connected to opening 54 as is shown, for example, in FIG. 24B.

Figure 25A:
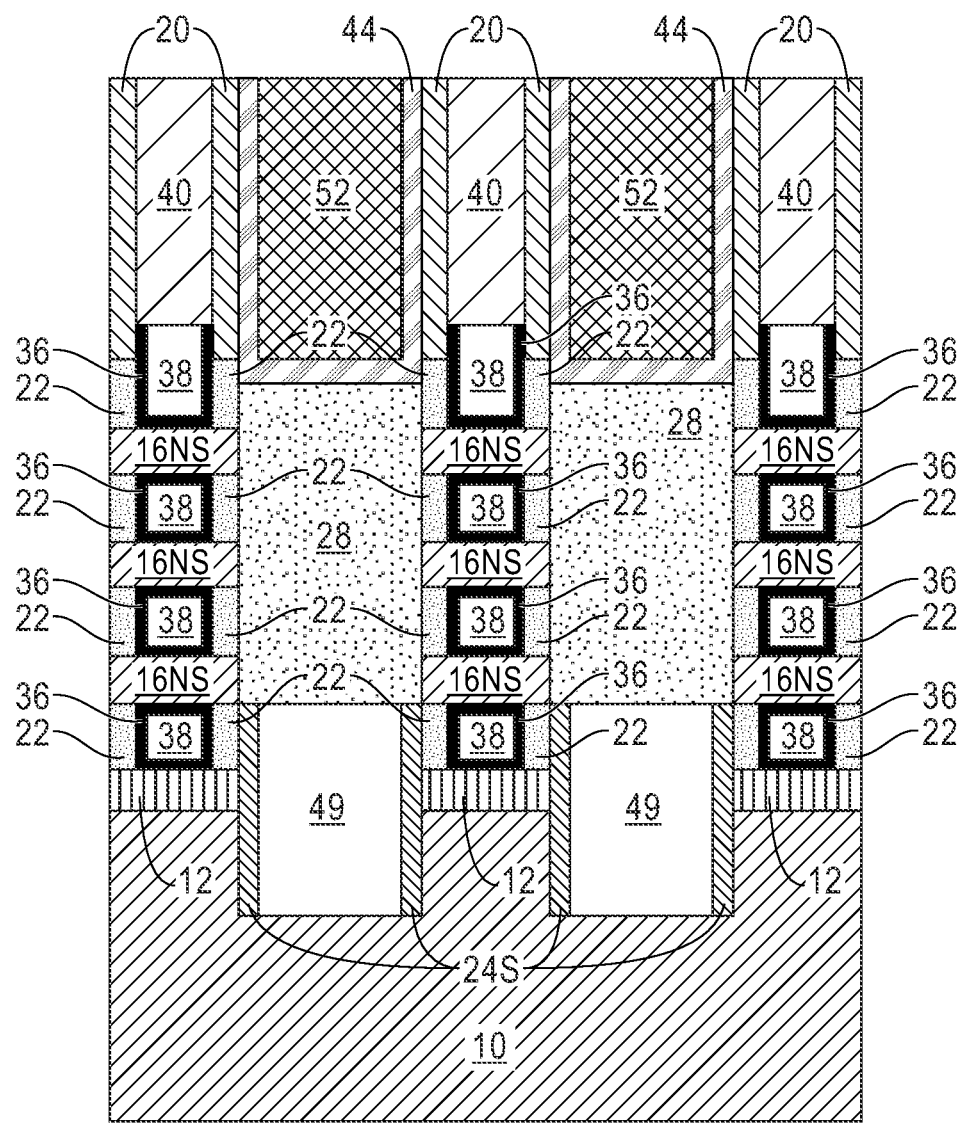
FIGS. 25A and 25B are cross sectional views of the exemplary structure shown in FIGS. 24A and 24B, respectively, after forming additional interlayer dielectric material laterally adjacent to the source/drain region and in the opening, wherein the additional interlayer dielectric material fills in the opening and seals the horizontal cavity providing an air gap beneath the source/drain region.
Figure 25C:
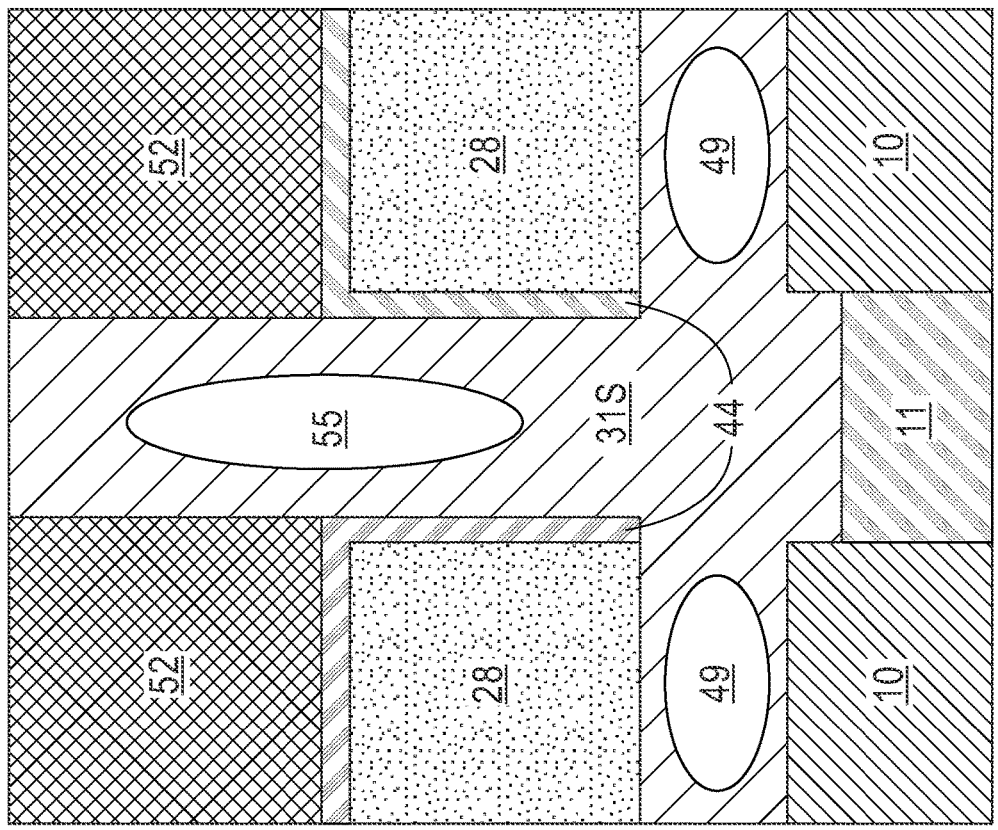
FIG. 25C is a cross sectional view of the exemplary structure shown in FIG. 24B after forming additional interlayer dielectric material laterally adjacent to the source/drain region and in the opening, wherein the additional interlayer dielectric material fills in the opening and seals the horizontal cavity providing an air gap beneath the source/drain region in accordance with another embodiment of the present application.
Figure 25B:
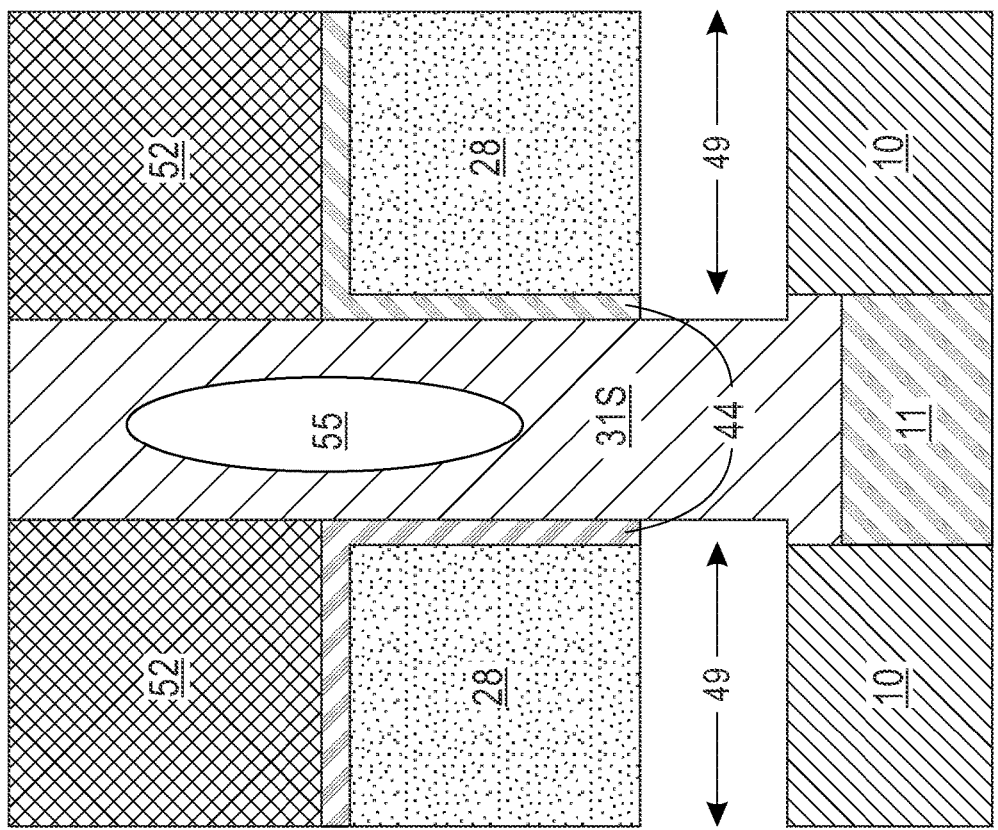

Referring now to FIGS. 25A and 25B, there are illustrated the exemplary structure shown in FIGS. 24A and 24B, respectively, after forming additional interlayer dielectric material laterally adjacent to the source/drain region 28 and in opening 54, wherein the additional interlayer dielectric material fills in the opening 54 and seals the horizontal cavity 48 providing an air gap 49 beneath the source/drain region 28. FIG. 25C shows an alternative embodiment of the present application. In some embodiments, the additional interlayer dielectric material is formed on the twice recessed ILD material layer 30P. In other embodiments, the additional interlayer dielectric material is formed on the STI structure 11. In either embodiment, a ILD material-containing layer 31 is provided. The ILD material-containing layer 31 can include the twice recessed ILD material layer 30P and the additional interlayer dielectric material, or only the additional dielectric material layer. The additional interlayer dielectric material includes one of the dielectric materials mentioned above for ILD material layer 30. Typically, the additional interlayer dielectric material is compositionally the same as the dielectric material that provides ILD material layer 30. The additional ILD material can be formed utilizing one of the deposition processes mentioned above for forming the ILD material layer 30. A planarization process such as, for example, chemical mechanical polishing (CMP) can follow the deposition of the additional ILD material. In this embodiment, the ILD material-containing structure 31S has a topmost surface that is typically coplanar with the hard mask 52.

In some embodiment, a vertical air gap 55 can be present in a portion of the ILD material-containing layer 31 that is located between the source/drain regions of different device regions. This vertical air gap is typically located laterally adjacent to these source/drain regions. The vertical air gap 55 forms during the deposition of the ILD material when the distance between the source/drain regions is small. In other embodiments, vertical air gap 55 is not present.

In some embodiments, and as is shown in FIG. 25B, the ILD material-containing layer 31 does not extend beneath the source/drain region 28. In such an embodiment, the air gap 49 has an outer boundary defined by the ILD material-containing layer 31 and the air gap 49 directly contacts a bottommost surface of the source/drain region 28 and a topmost surface of the semiconductor substrate 10. In other embodiments, and as is shown in FIG. 25C, the ILD material-containing layer extends beneath the source/drain region 28 and is present between a bottommost surface of the source/drain region 28 and the air gap 49, and between a topmost surface of the semiconductor substrate 10 and the air gap 49. In this embodiment, a portion of the interlayer dielectric material-containing structure 31S surrounds the air gap 49.

Figure 26A:
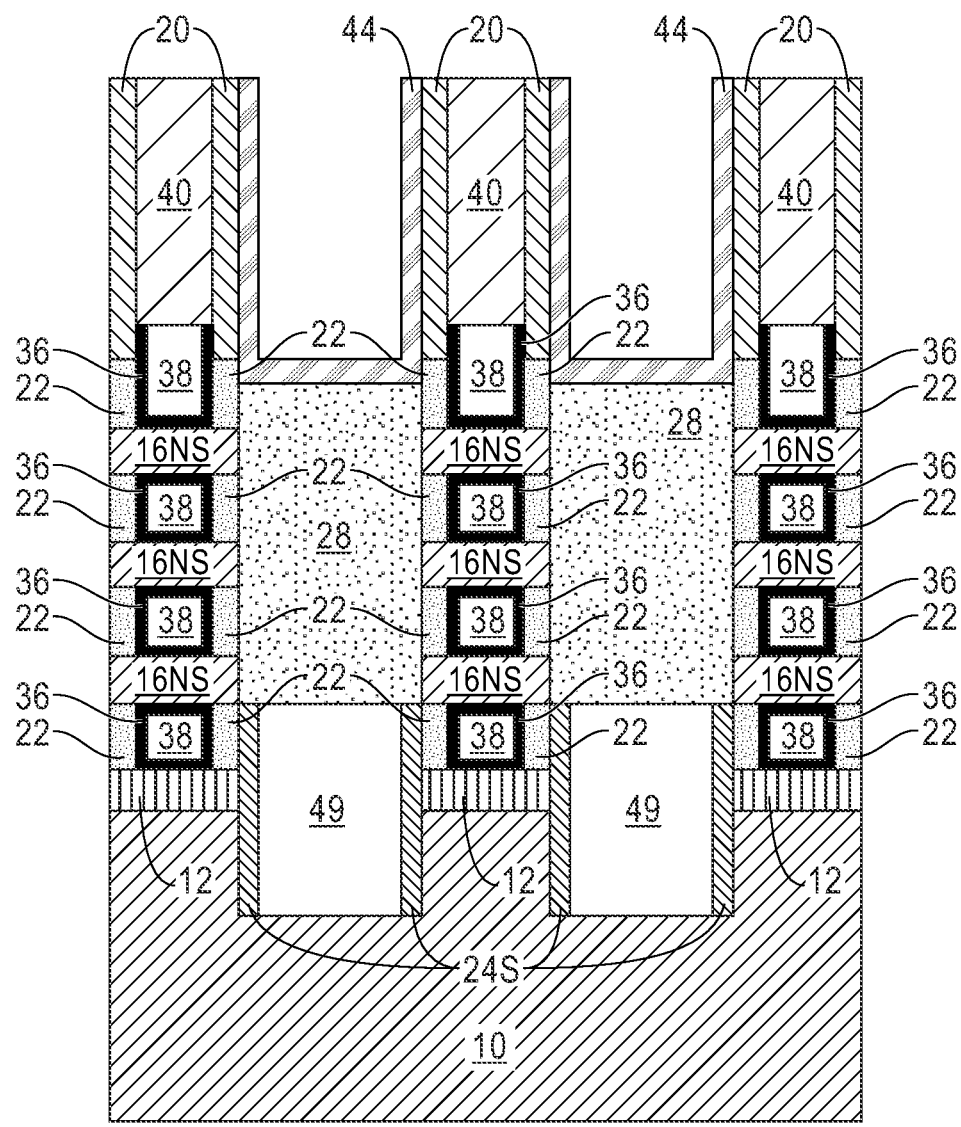
FIGS. 26A and 26B are cross sectional views of the exemplary structure shown in FIGS. 25A and 25B, respectively, after removing the hard mask from the topmost surface of the source/drain region.
Figure 26B:
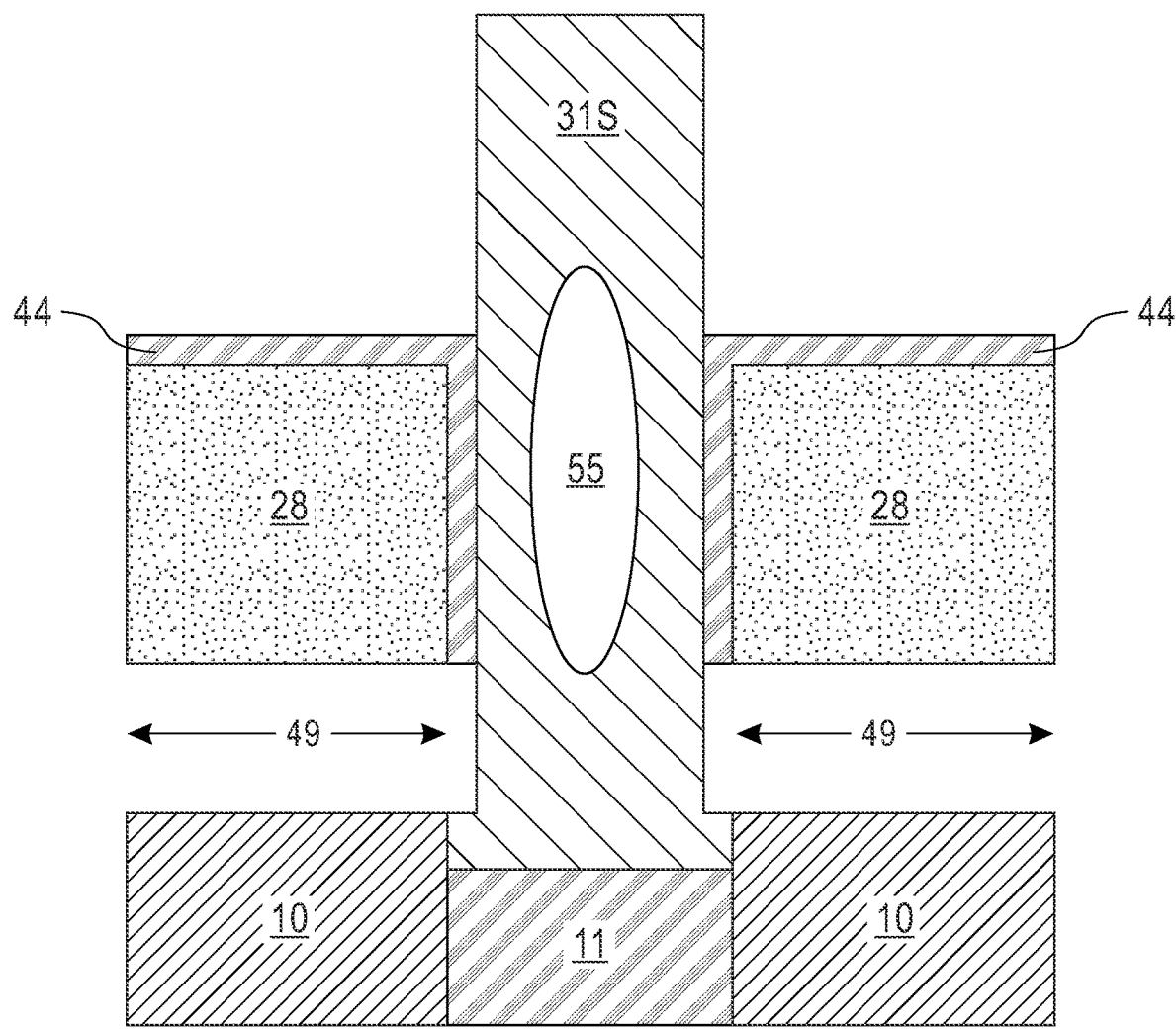

Referring now to FIGS. 26A and 26B, there are illustrated the exemplary structure shown in FIGS. 25A and 25B, respectively, after removing the hard mask 52 from the topmost surface of the source/drain region 28. The hard mask 52 can be removed utilizing an etching process that is selective in removing the hard mask material that provides hard mask 52.

Figure 27A:
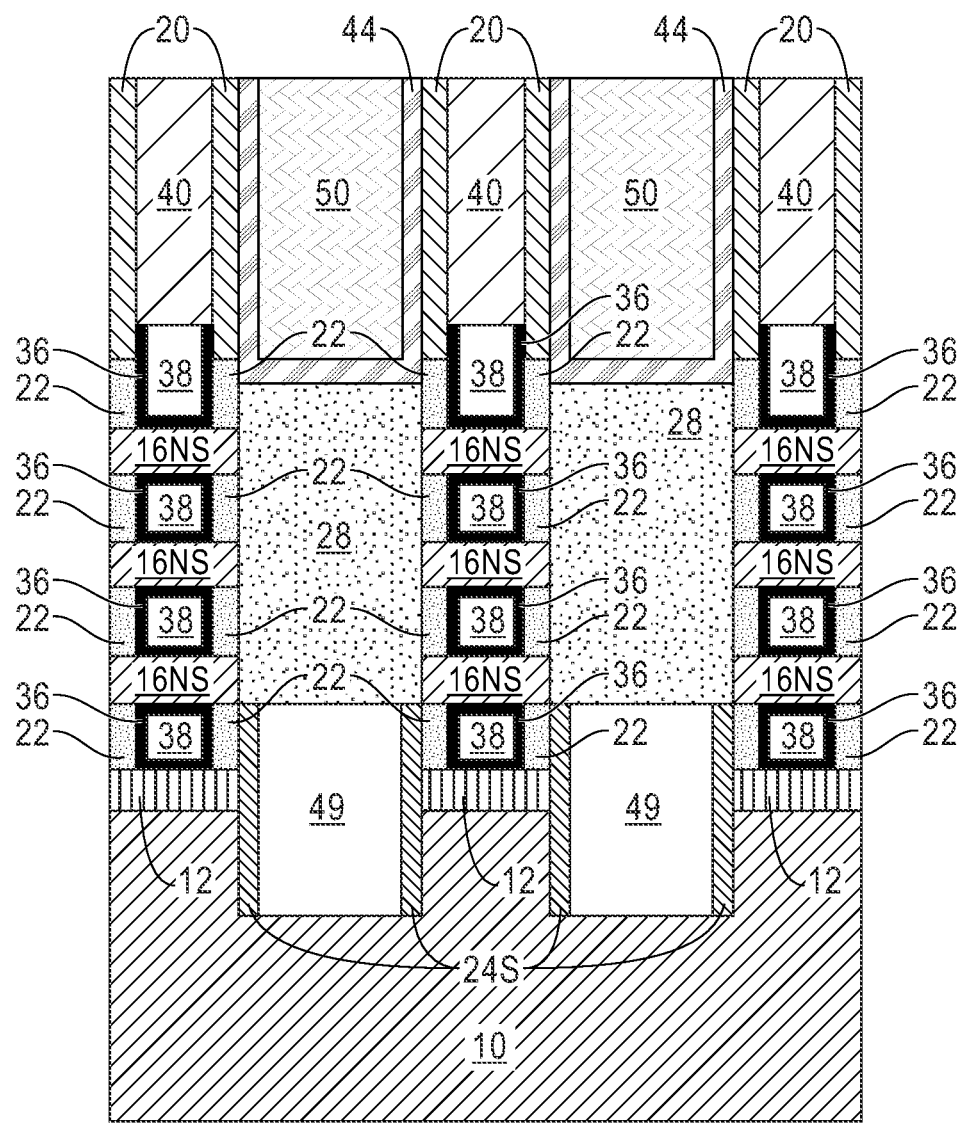
FIGS. 27A and 27B are cross sectional views of the exemplary structure shown in FIGS. 26A and 26B, respectively, after forming a source/drain contact structure on the source/drain region.
Figure 27B:
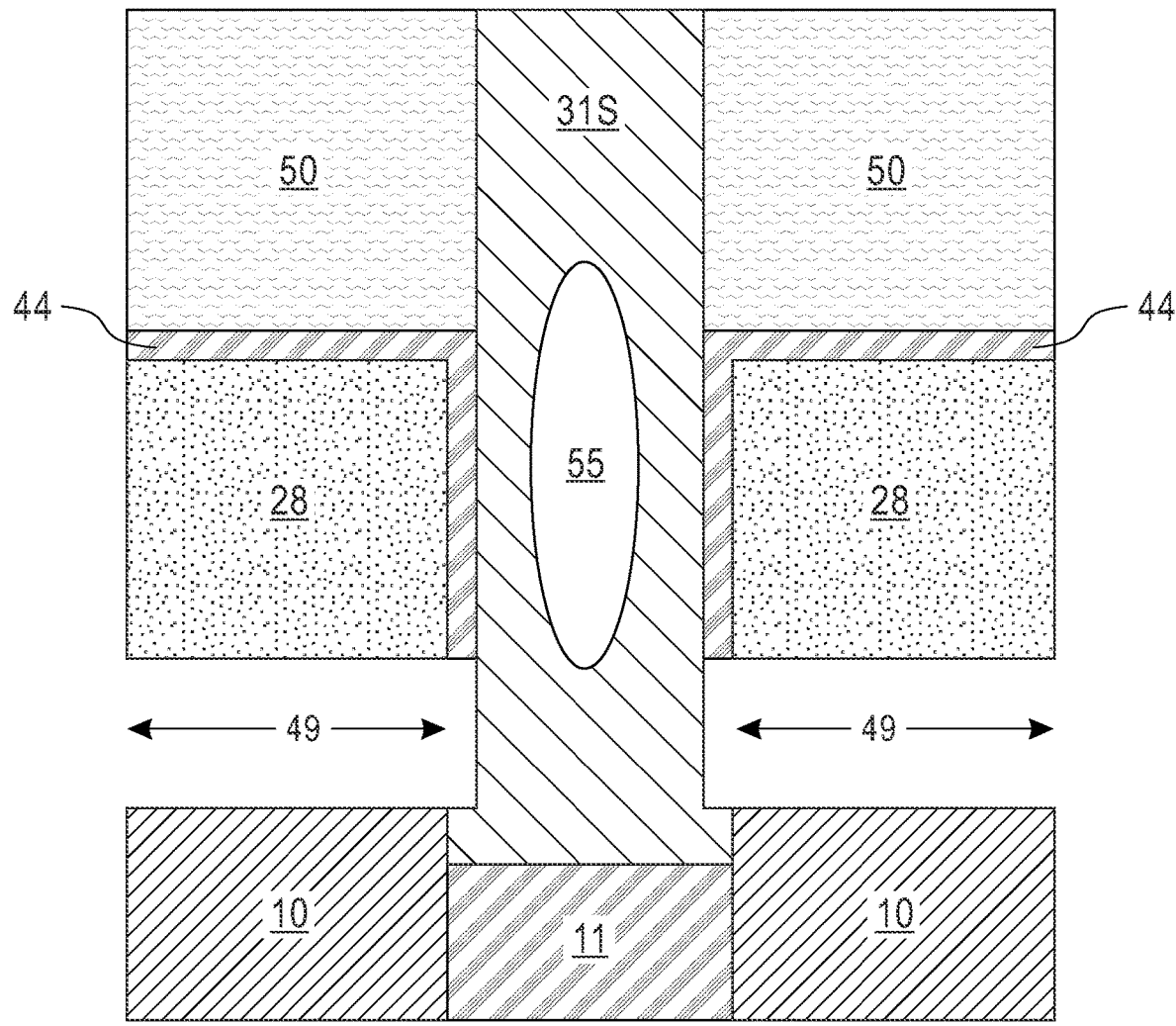

Referring now to FIGS. 27A and 27B, there are illustrated the exemplary structure shown in FIGS. 26A and 26B, respectively, after forming a source/drain contact structure 50 on the source/drain region 28. The source/drain contact structure 50 is also formed laterally adjacent to the ILD material-containing structure 31S as is shown, for example, in FIG. 27B. In some embodiments (not shown), a contact liner (as defined above) can be present along the sidewalls and bottom wall of the source/drain contact structure 50. In one or more embodiments in which a contact liner is present, the contact liner (not shown) can include a silicide liner, such as Ti, Ni, NiPt, etc., and a diffusion barrier material, as mentioned above. The contact liner can be formed utilizing a conformal deposition process as mentioned above and the contact liner can have a thickness within the range mentioned above in the previous embodiment of the present application.

The source/drain contact structure 50 includes a contact conductor material, as defined above. The contact conductor material can be formed by any suitable deposition method such as, for example, ALD, CVD, PVD or plating. A planarization process can be used to remove the contact conductor material and the contact liner (when provided) that are located above the ILD material-containing structure 31S. The remaining contact conductor material and if present, the contact liner provide the source/drain contact structure 50 shown in FIGS. 27A and 27B. In this embodiment, source/drain contact structure 50 is spaced apart from the source/drain region 28 by at least the metal liner 44; metal liner is also present along the sidewall of the source/drain region 28. In this embodiment, the source/drain contact structure 50 has a topmost surface that is coplanar with at least a topmost surface of the ILD material-containing structure 31S. In this embodiment, the metal liner 44 is present along a sidewall and a bottom wall of the source/drain contact structure as is shown, for example, in FIG. 27A.

FIGS. 27A-27B illustrate an exemplary semiconductor structure of the present application in which an air gap 49 is located beneath the source/drain region 28 of a nanosheet device that includes a functional gate structure 36, 38 wrapped around at least one suspended semiconductor channel material nanosheet 16NS. The air gap 49 does not extend beneath the functional gate structure 36, 38. Instead, bottom dielectric isolation layer 12 is located beneath the functional gate structure 36, 38 and the bottom dielectric isolation layer 12.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a nanosheet device located on a semiconductor substrate and comprising at least one semiconductor channel material nanosheet of a nanosheet stack and a functional gate wrapping around a portion of the at least one semiconductor channel material nanosheet of the nanosheet stack;
   a source/drain region extending outward from a sidewall of the at least one semiconductor channel material nanosheet of the nanosheet stack;
   an air gap located between the source/drain region and the semiconductor substrate, wherein the air gap extends beneath a topmost surface of the semiconductor substrate and stops on a sub-surface of the semiconductor substrate; and
   a dielectric trench spacer present laterally adjacent to the air gap and on a sidewall of the semiconductor substrate that is located directly beneath the functional gate structure, wherein the dielectric trench spacer is I-shaped, and has a bottommost surface in direct physical contact with the sub-surface of the semiconductor substrate.

2. The semiconductor structure of claim 1, further comprising a source/drain contact structure located above the source/drain region.

3. The semiconductor structure of claim 2, further comprising a metal spacer located on a sidewall of the source/drain contact structure, but not along a bottom wall of the source/drain contact structure.

4. The semiconductor structure of claim 3, wherein the source/drain contact structure directly contacts a topmost surface of the source/drain region, and a portion of the metal spacer is located along a sidewall of the source/drain region.

5. The semiconductor structure of claim 2, further comprising a metal liner located on a sidewall and a bottom wall of the source/drain contact structure.

6. The semiconductor structure of claim 5, wherein the metal liner is located on a topmost surface of the source/drain region, and a portion of the metal liner extends along a sidewall of the source/drain region.

7. The semiconductor structure of claim 1, further comprising a bottom dielectric isolation layer between a bottommost surface of the functional gate structure and the semiconductor substrate.

8. The semiconductor structure of claim 1, further comprising an interlayer dielectric material-containing structure located laterally adjacent to the source/drain region, wherein the interlayer dielectric material-containing structure separates a first device region containing the nanosheet device from a second device region containing another nanosheet device.

9. The semiconductor structure of claim 8, wherein the interlayer dielectric material-containing structure does not extend beneath the source/drain region and a portion of the interlayer dielectric material-containing structure defines an outer boundary of the air gap.

10. The semiconductor structure of claim 8, wherein the interlayer dielectric material-containing structure extends beneath the source/drain region and surrounds the air gap.

11. The semiconductor structure of claim 8, wherein the interlayer dielectric material-containing structure includes a vertical air gap present therein that is laterally adjacent to the source/drain region.

12. The semiconductor structure of claim 9, wherein the another nanosheet device comprises at least one other semiconductor channel material nanosheet of another nanosheet stack, another source/drain region extending outward from a sidewall of the at least one other semiconductor channel material nanosheet of the another nanosheet stack, and another air gap located between the another source/drain region and the semiconductor substrate.

* * * * *